(12) United States Patent
Weber et al.

(10) Patent No.: US 8,416,515 B2
(45) Date of Patent: Apr. 9, 2013

(54) POSITIONING UNIT AND ALIGNMENT DEVICE FOR AN OPTICAL ELEMENT

(75) Inventors: Ulrich Weber, Ulm (DE); Jens Kugler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/230,398

(22) Filed: Sep. 12, 2011

(65) Prior Publication Data

US 2012/0019798 A1   Jan. 26, 2012

Related U.S. Application Data

(63) Continuation of application No. 12/768,286, filed on Apr. 27, 2010, now Pat. No. 8,035,903, which is a continuation of application No. 11/631,370, filed as application No. PCT/EP2005/006583 on Jun. 18, 2005, now Pat. No. 7,738, 193.

(60) Provisional application No. 60/584,095, filed on Jun. 29, 2004.

(51) Int. Cl.
*G02B 7/02* (2006.01)

(52) U.S. Cl. .................................. 359/811; 359/819

(58) Field of Classification Search .................. 359/811, 359/819
See application file for complete search history.

(56) References Cited

U.S. PATENT DOCUMENTS

| | | | |
|---|---|---|---|
| 5,986,827 A * | 11/1999 | Hale | ........................... 359/822 |
| 6,275,344 B1 | 8/2001 | Holderer | |
| 6,552,862 B2 | 4/2003 | Dieker | |
| 6,580,570 B2 | 6/2003 | Becker | |
| 6,859,337 B2 | 2/2005 | Oshino et al. | |
| 6,870,632 B2 | 3/2005 | Petasch | |
| 6,922,293 B2 | 7/2005 | Watson et al. | |
| 6,967,792 B2 | 11/2005 | Weber | |
| 7,433,019 B2 | 10/2008 | Kiuchi et al. | |
| 7,738,193 B2 | 6/2010 | Weber et al. | |
| 8,035,903 B2 | 10/2011 | Weber et al. | |
| 2002/0044260 A1 | 4/2002 | Takahashi et al. | |
| 2002/0080339 A1 | 6/2002 | Takahashi | |
| 2002/0085292 A1 | 7/2002 | Becker | |
| 2002/0109437 A1 | 8/2002 | Sorg et al. | |
| 2002/0163741 A1 | 11/2002 | Shibazaki | |
| 2002/0176094 A1 | 11/2002 | Petasch et al. | |
| 2004/0174618 A1 | 9/2004 | Kikuchi | |
| 2005/0110447 A1 | 5/2005 | Weber | |

(Continued)

FOREIGN PATENT DOCUMENTS

| | | |
|---|---|---|
| DE | 221 563 | 4/1985 |
| DE | 199 10 947 | 9/2000 |

(Continued)

OTHER PUBLICATIONS

The International Search Report for the corresponding PCT Application No. PCT/EP05/006583, filed Jun. 18, 2005.

*Primary Examiner* — James Jones

(74) *Attorney, Agent, or Firm* — Fish & Richardson P.C.

(57) ABSTRACT

The disclosure provides a positioning unit for an optical element in a microlithographic projection exposure installation having a first connecting area for connection to the optical element, and having a second connecting area for connection to an object in the vicinity of the optical element.

23 Claims, 16 Drawing Sheets

U.S. PATENT DOCUMENTS

| | | | |
|---|---|---|---|
| 2006/0007563 | A1 | 1/2006 | Weber |
| 2007/0206297 | A1 | 9/2007 | Weber et al. |
| 2009/0002660 | A1 | 1/2009 | Kiuchi |
| 2010/0245847 | A1 | 9/2010 | Weber et al. |

FOREIGN PATENT DOCUMENTS

| | | |
|---|---|---|
| DE | 100 62 786 | 6/2002 |
| DE | 101 06 605 | 8/2002 |
| DE | 102 12 547 | 10/2003 |
| DE | 102 26 655 | 1/2004 |
| DE | 103 44 178 | 4/2005 |
| EP | 0 605 103 | 7/1994 |
| EP | 1 137 054 | 9/2001 |
| EP | 1 209 500 | 5/2002 |
| EP | 1 211 560 | 6/2002 |
| EP | 1 220 012 | 7/2002 |
| EP | 1 312 965 | 5/2003 |
| EP | 1 321 822 | 6/2003 |
| EP | 1 369 745 | 12/2003 |
| EP | 1 420 302 | 5/2004 |
| EP | 1 643 543 | 4/2006 |
| JP | 1054392 | 3/1989 |
| JP | 2040593 | 2/1990 |
| JP | 10 228661 | 8/1998 |
| JP | 2002-131605 | 5/2002 |
| JP | 2002-350699 | 12/2002 |
| WO | WO 99/49504 | 9/1999 |
| WO | WO 03/016976 | 2/2003 |
| WO | WO 03/052511 | 6/2003 |
| WO | WO 03/107095 | 12/2003 |
| WO | WO 2004/107048 | 12/2004 |
| WO | WO 2005/006417 | 1/2005 |
| WO | WO 2005/026801 | 3/2005 |

* cited by examiner

POSITIONING UNIT AND ALIGNMENT DEVICE FOR AN OPTICAL ELEMENT

CROSS REFERENCE TO RELATED APPLICATIONS

This application is a continuation of U.S. application Ser. No. 12/768,286, filed Apr. 27, 2010, which is a continuation of U.S. application Ser. No. 11/631,370, filed Mar. 16, 2007, now U.S. Pat. No. 7,738,193, which is a 35 U.S.C. §371 application of and claims priority to PCT International Application Number PCT/EP2005/006583, filed Jun. 18, 2005, and was published in German, and which was based on U.S. Provisional Patent Application No. 60/584,095, filed Jun. 29, 2004, and the teachings of all the applications are incorporated herein by reference.

The invention relates to a positioning unit for an optical element in a microlithographic projection exposure installation having a first connecting area for connection to the optical element, and having a second connecting area for connection to an object in the vicinity of the optical element.

The invention also relates to an apparatus for adjustment of an optical element having an optical axis with respect to an external holder in an objective structure or with respect to holders which are located adjacent to it, with the optical element being connected to the external holder via a plurality of intermediate parts which are provided with adjustment devices.

With regard to the prior art, reference is made to U.S. Pat. No. 5,986,827, US 2002/0163741 A1, US 2002/0176094 A1, WO 2005/026801 A2, DE 103 44 178 A1, DE 102 26 655 A1, DE 199 10 947 A1, EP 1312 965 A1 and EP 1 209 500 A2.

Some of the already known adjustment apparatuses have only a low carrying capability, are cumbersome and are of a complex design, and in some cases also promote undesirable oscillation excitations of the optical element.

One preferred field of use for adjustment apparatuses as described above is in a projection exposure installation having a projection objective for microlithography, for production of semiconductor elements, since extremely accurate imaging qualities are required for this purpose.

However, optical elements can become decentered by manufacturing or installation inaccuracies during installation with respect to mechanical reference surfaces on the holder. Mechanical reference surfaces may, for example, be centering collars or holder flanges, with respect to which the holder is aligned with respect to an objective structure, for example a projection objective. Reference surfaces such as these are likewise also used for alignment of individual holders with respect to one another.

Although tilting tolerances can be compensated for by so-called spherization for example of a lens as an optical element before being bonded into the internal holder, subsequent process steps after it has been bonded in can nevertheless lead to the lens becoming decentered with respect to the reference surfaces on the holder. This can occur, for example, as a result of adhesive shrinkage as the adhesive cures.

With certain holding techniques, for example when optical elements are clamped, a spherization process can be carried out only with great difficulty, so that an apparatus is required for adjustment of the optical element with respect to the reference surfaces on the holder.

The subject of the present invention is to provide a positioning unit for an optical element, which positioning unit has a high level of stiffness and in which case positioning should be possible for a plurality of degrees of freedom.

A further subject matter of the present invention is to avoid the disadvantages of the prior art as stated above, in particular the provision of an adjustment apparatus in which an optical element can be moved as far as possible in all six degrees of freedom with respect to the reference surfaces and can be adjusted appropriately, but in which a sufficiently high stiffness level can be maintained despite very precise adjustment.

According to the invention, in the case of a positioning unit for an optical element in a microlithographic position exposure installation, this object is achieved by a first connecting area A for connection to an optical element and a second connecting area B for connection to an object in the vicinity of the optical element, at least two levers, which are connected via their respective lever bearings to the second connecting area B, and whose respective load arm is connected by means of a joint and via an intermediate element C, which acts on this joint, to the first connecting area A, having adjustment devices or actuators arranged on the respective force arms of the levers in which, in a first position, the first connecting area A and the second connecting area B are arranged relative to one another such that the lever bearings of the at least two levers and the joints which are associated with these levers have approximately parallel rotation axes, which lie approximately on one plane in the first position.

In this case, the first position is advantageously a basic position, and a second position is a deflected position of the levers.

According to the invention, in this case, the first connecting area A may be a head part which is connected to the optical element directly or via an inner ring. The second connecting area B may be a foot part, which is firmly connected to an external holder or forms a part of the external holder.

The intermediate element C may be at least one moving intermediate part. If an adjustment capability in six degrees of freedom is desired, correspondingly more intermediate elements must be provided.

According to a further subject matter of the invention, in the case of an apparatus in which an optical element is connected via adjustment devices to an external holder, this object is achieved in that each adjustment device has a foot part, which is arranged on the external holder and on which moving intermediate parts are arranged and are connected to adjusting elements in such a manner that first moving intermediate parts can rotate about an axis at right angles to a z-axis, in which the adjusting elements are connected via second moving intermediate parts directly or via a center part to the optical element, in which, in the case of fixed adjusting elements, the second moving intermediate parts which are arranged between the optical element or a center part and the adjusting elements allow a rotary movement of the optical element with respect to the foot part about an axis at right angles to the z-axis.

In this case, the z-axis may advantageously lie on a connecting line between the head part, the center part and the foot part.

The z-axis is preferably the optical axis.

A further advantageous refinement provides for the second intermediate parts to be arranged at an angle α to the z-axis.

The positioning unit according to the invention and the apparatus allow exact positioning and—if required—linear movement and tilting of the optical element with respect to the external holder even immediately before installation in the objective structure, for example, a projection objective. This means that all of the centering areas of the optical element with respect to the external holder can be corrected according to the invention.

The apparatus according to the invention also makes it possible for the optical element still to be moved and to be positioned appropriately exactly in use after installation of the holder in the objective.

One highly advantageous refinement of the invention consists in that the adjusting elements are connected via the second moving intermediate parts to the center part, with the center part being connected to a head part which is arranged on an internal holder or on the optical element, and with the center part having at least one third moving intermediate part being provided in such a manner that the head part can be moved in a direction at right angles to the z-axis with respect to the center part, and can be rotated about another axis at right angles to the z-axis and about the z-axis with respect to the center part.

In this case, the axis which is at right angles to the z-axis is preferably the x-axis, and the other axis is the y-axis.

The arrangement according to the invention of the intermediate elements, which are preferably in the form of solid hinged joints in the form of leaf springs or levers like leaf springs, results in an adjustment mechanism by means of which, if required, an optical element can be moved in up to six degrees of freedom relative to the external holder.

However, in this case, small cross sections, as are present in the prior art, can be avoided in the case of solid hinged joints, as a result of which the overall mechanism is considerably more resistant to shocks and is stiffer, so that it cannot be excited to carry out undesirable oscillations as easily.

Furthermore, the adjustment apparatus according to the invention can be arranged in a very space-saving manner. This applies in particular to a low physical height, which can be achieved by skillful arrangement of the solid hinged joints, because, in contrast to conventional adjustment apparatuses, the guidance for the movement of the adjusting levers or adjusting elements is integrated in the tilting decoupling about the x-axis. This makes it possible to reduce the number of solid hinged joints, without having to use solid hinged joints with a very small cross section, which bend easily about two axes. Solid hinged joints which bend easily about two axes can withstand only small loads, such as those which occur in the case of shocks, because of the very small cross section.

Advantageous developments are specified in the other dependent claims and will become evident from the exemplary embodiments which are described in the following text, in principle, with reference to the drawing, in which:

FIG. 20 and

Figure 18:
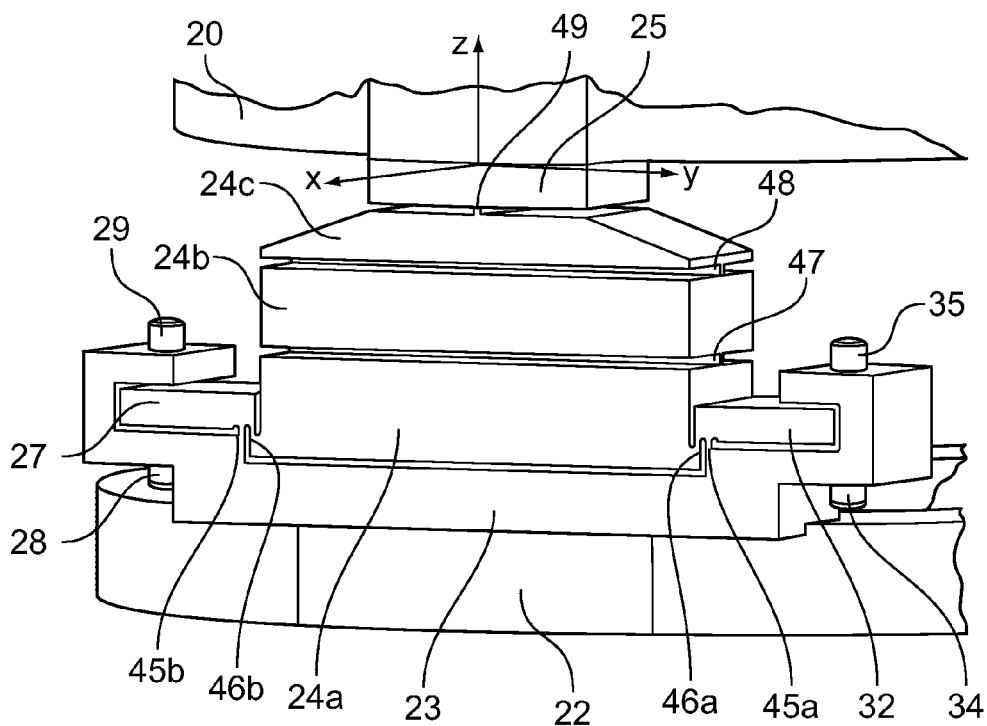
FIG. 18 shows a further embodiment of an adjustment device and positioning unit.
Figure 21:
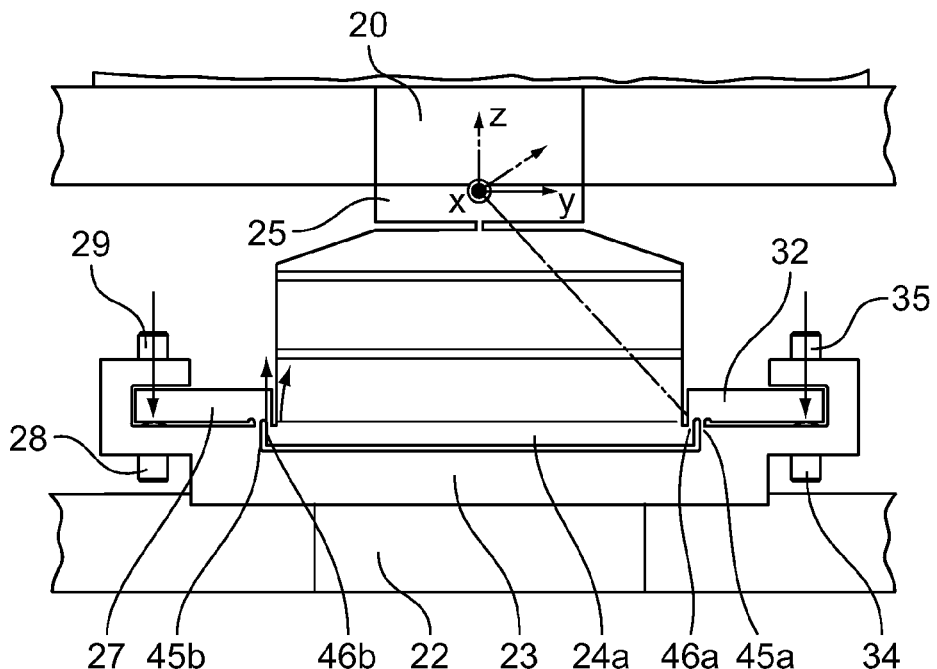
Figure 22:
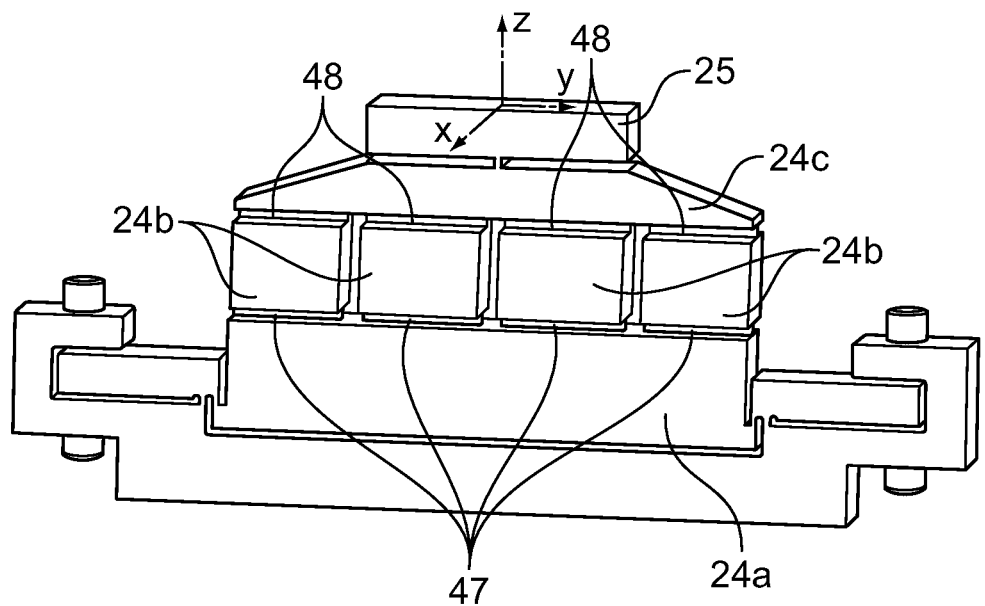
Figure 23:
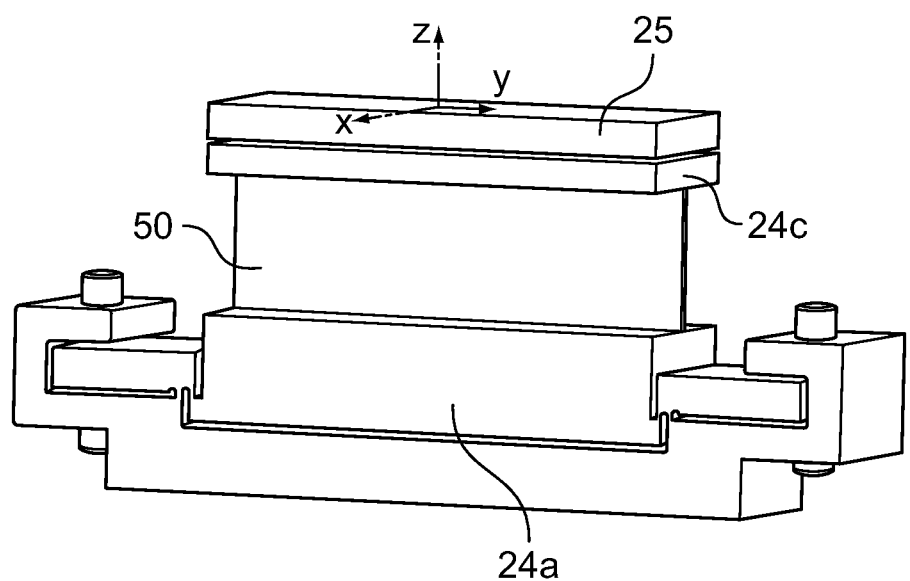

FIG. 21 show illustrations of movement capabilities for the exemplary embodiment shown in FIG. 18;

FIG. 22 shows a further embodiment with greater rotation flexibility about the z-axis;

FIG. 23 shows an embodiment similar to that shown in FIG. 22, but in a simpler form;

FIG. 24 and

Figure 3:
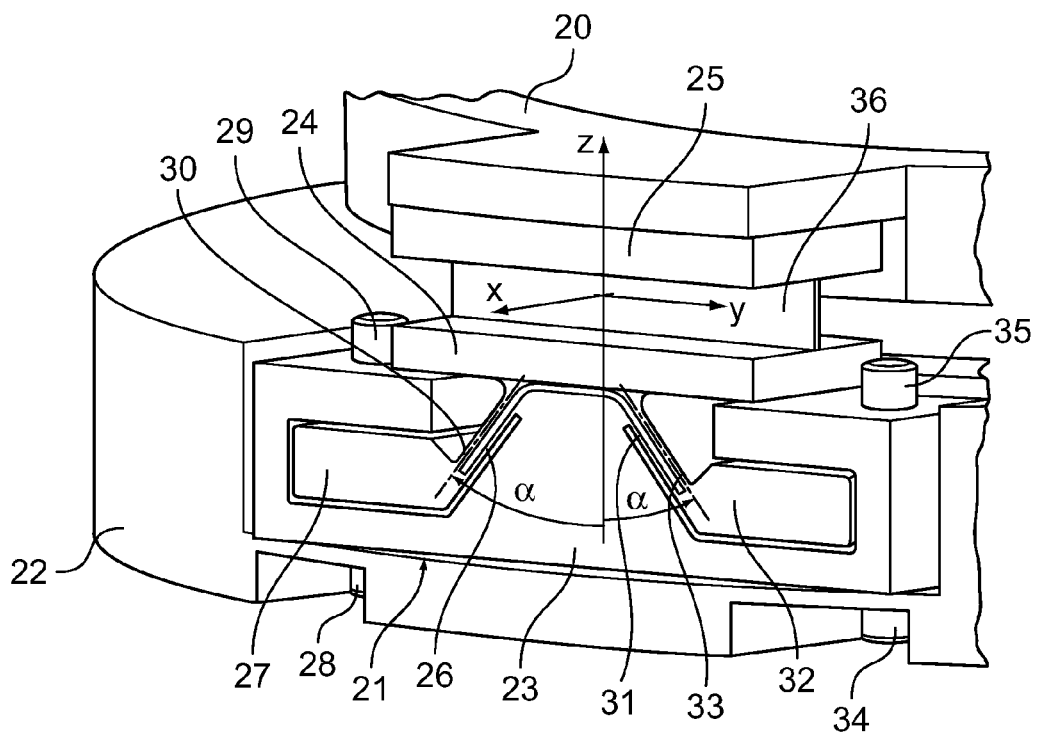
FIG. 3 shows an enlarged illustration of an adjustment device as shown in FIG. 2.
Figure 19:
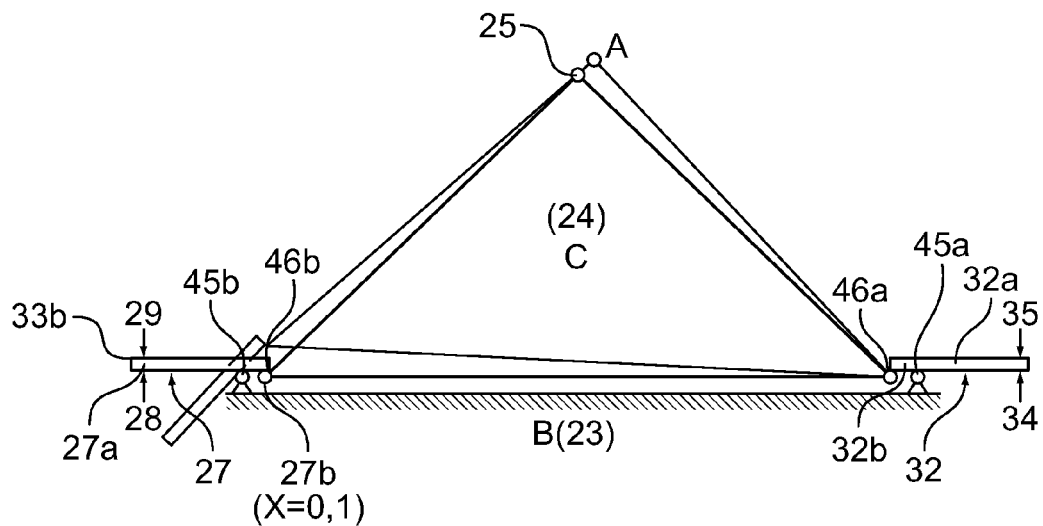
FIG. 19 shows an outline illustration with force and load arms of the levers and with rotating joints, based on FIG. 18.
Figure 25:
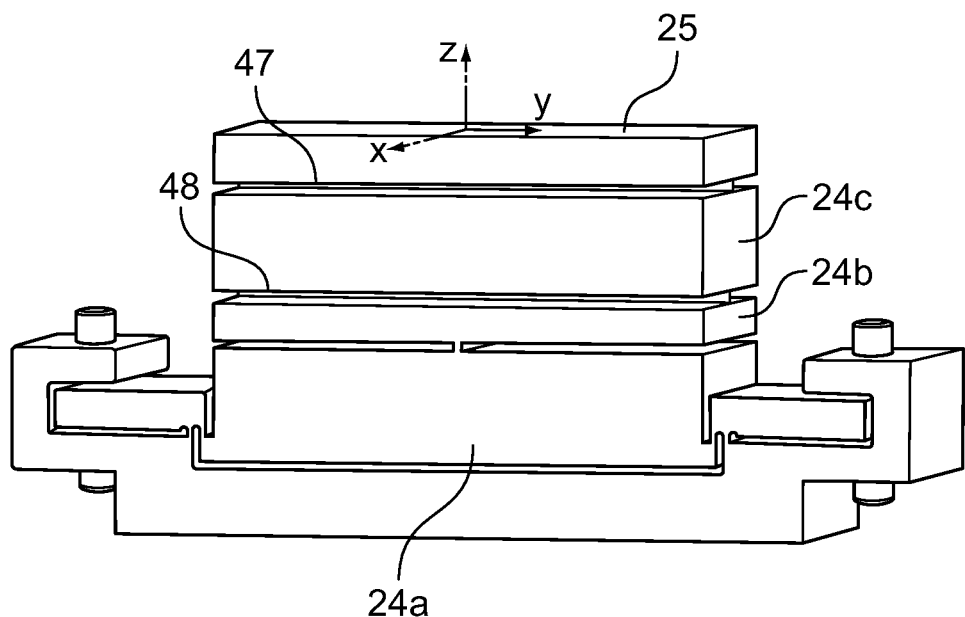
Figure 26:
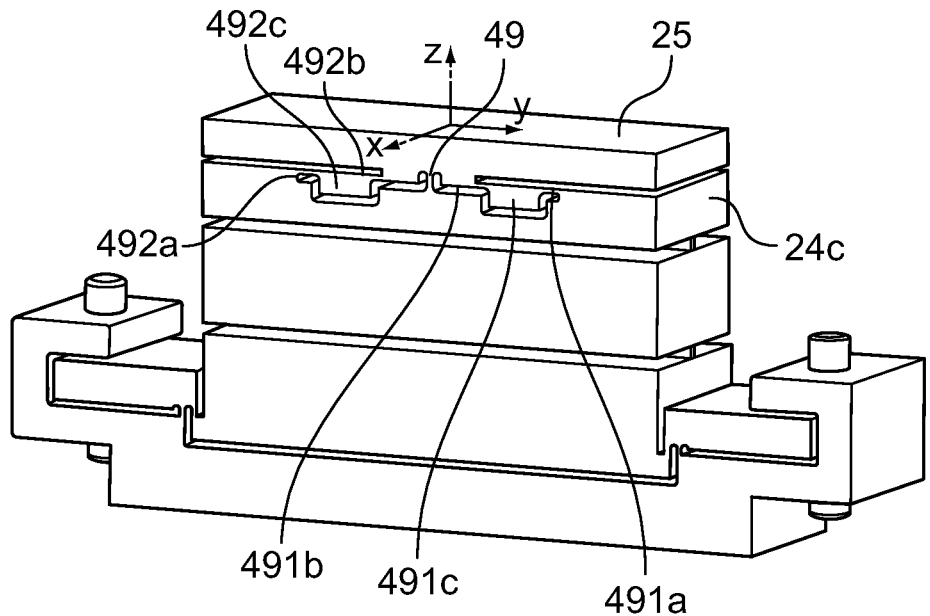
Figure 27:
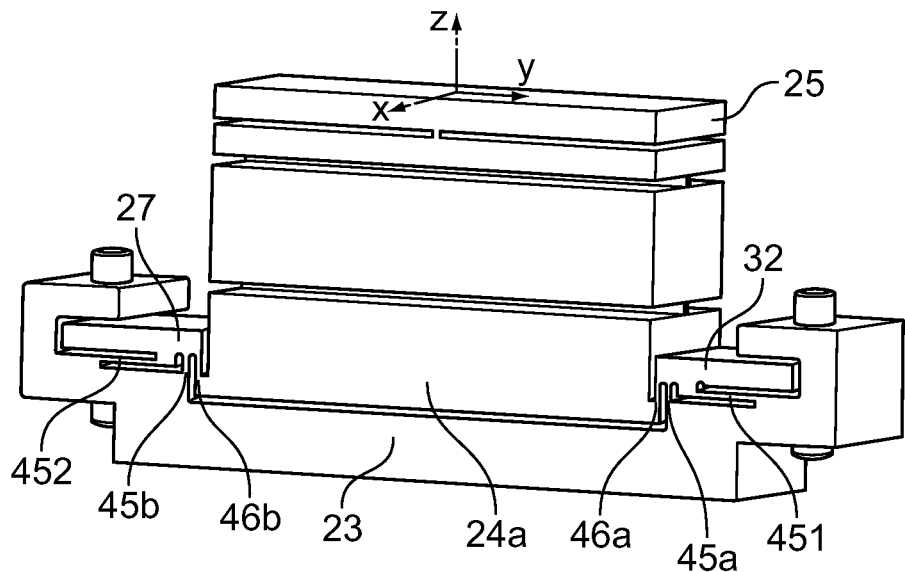
Figure 28:
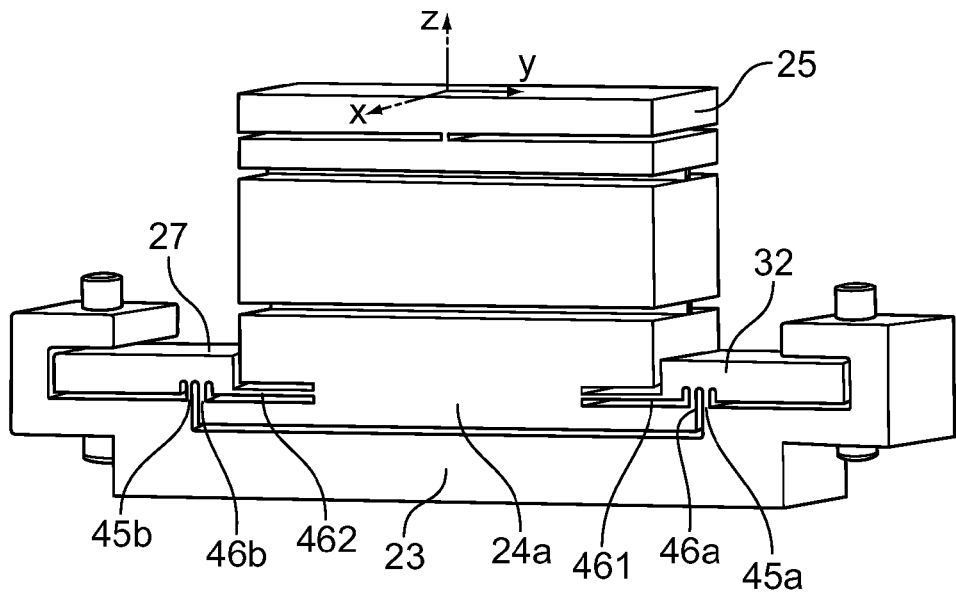
Figure 29:
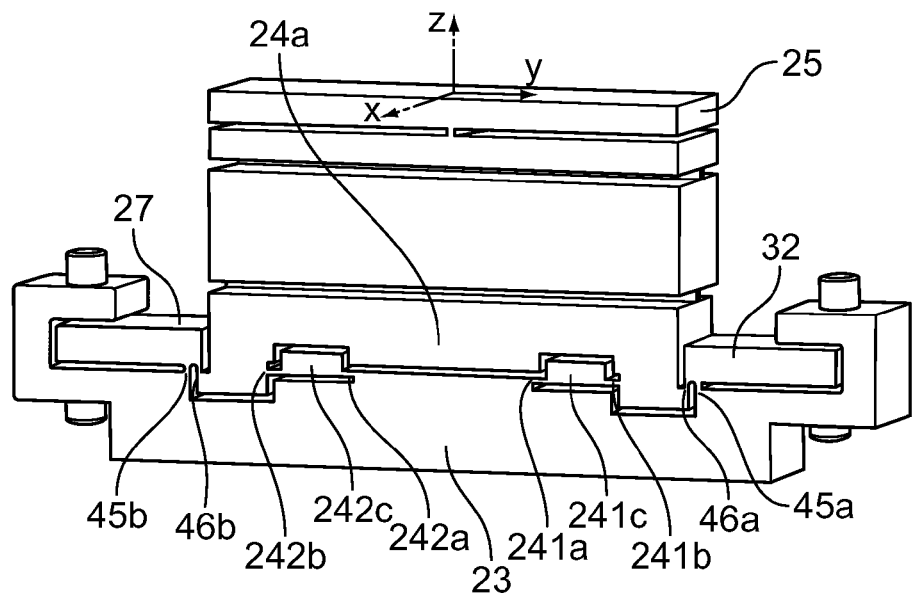
Figure 30:
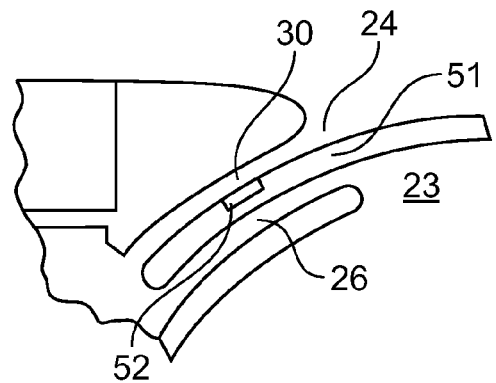
Figure 31:
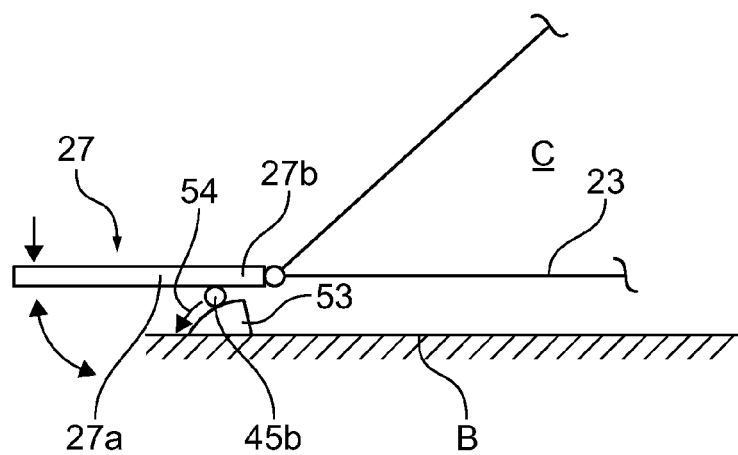
Figure 32:
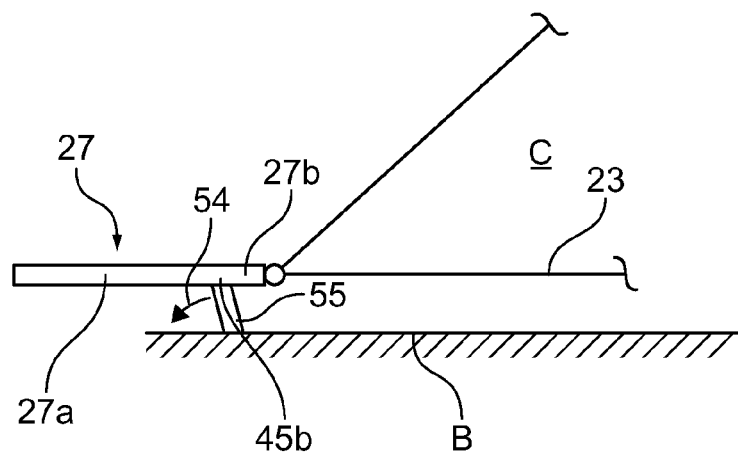

FIG. 25 show two further embodiments of positioning units;

FIG. 26 shows an embodiment with stiffening in the y-direction;

FIG. 27 shows an embodiment in which the hinged joints connected to the adjusting levers are reinforced;

FIG. 28 shows an embodiment in which adjusting levers as adjusting elements, and hinged joints which interact with them, are likewise reinforced;

FIG. 29 shows an embodiment in which a center part is stiffened in the y-direction by means of a jointed coupler;

FIG. 30 shows a detail of an enlargement from FIG. 3 with the two levers, which are like leaf springs, between the foot part and another embodiment of the center part;

FIG. 31 shows a detail from the outline illustration shown in FIG. 19, with another embodiment of a lever bearing; and FIG. 32 shows a detail of the outline illustration shown in FIG. 19 with a further embodiment of a lever bearing, in a similar form to the embodiment illustrated in FIG. 31.

Figure 1:
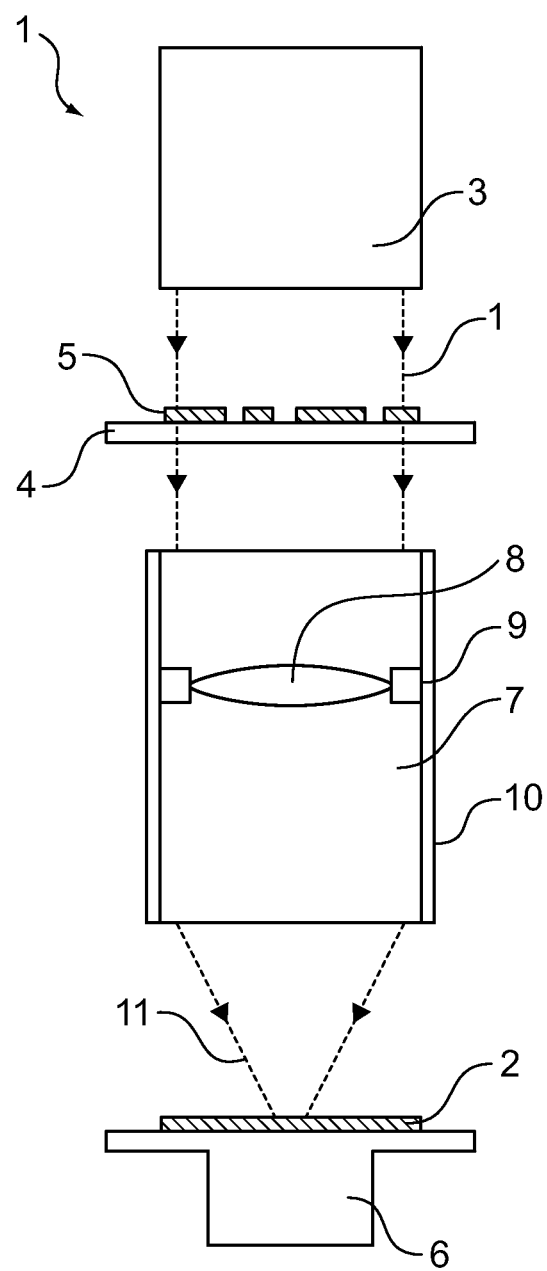
FIG. 1 shows a schematic illustration of projection exposure installation.

FIG. 1 illustrates a projection exposure installation 1 for microlithography. This is used for exposure of structures on a substrate which is coated with photosensitive materials, and which in general predominantly composed of silicon and is referred to as a wafer 2, for production of semiconductor components, for example computer chips.

In this case, the projection exposure installation 1 essentially comprises a lighting device, 3, a device 4 for holding and exact positioning of a mask which is provided with a grid-like structure, a so-called reticle 5, by means of which the subsequent structures on the wafer 2 are defined, a device 6 for holding, movement and exact positioning of this actual wafer 2, and an imaging device, specifically a projection objective 7 with a plurality of optical elements, such as lenses 8, which are mounted via holders 9 in an objective housing 10 of the projection objective 7.

The fundamental principle of operation in this case provides for the structures which are introduced into the reticle 5 to be imaged, reduced in size, on the wafer 2.

After the exposure has been carried out, the wafer 2 is moved onwards in the direction of the arrow, so that a large number of individual fields, each with the structure predetermined by the reticle 5, are exposed on the same wafer 2. Because of the step-by-step feed movement of the wafer 2 in the projection exposure installation 1, this installation is frequently also referred to as a stepper.

The lighting device 3 produces a projection beam 11, as is required for imaging of the reticle 5 on the wafer 2, for example light or similar electromagnetic radiation. A laser or the like may be used as the source for this radiation. The radiation is formed in the lighting device 3 by means of optical elements such that the projection beam 11 has the desired diameter, polarization, wavefront shape and similar characteristics on arrival at the reticle 5.

The projection beam 11 is used to produce an image of the reticle 5, which is transferred in an appropriately reduced form by the projection objective 7 onto the wafer 2, as has already been explained above. The projection objective 7 has a large number of individual refractive, defractive and/or reflective optical elements, such as lenses, mirrors, prisms, closure plates and the like.

Figure 2:
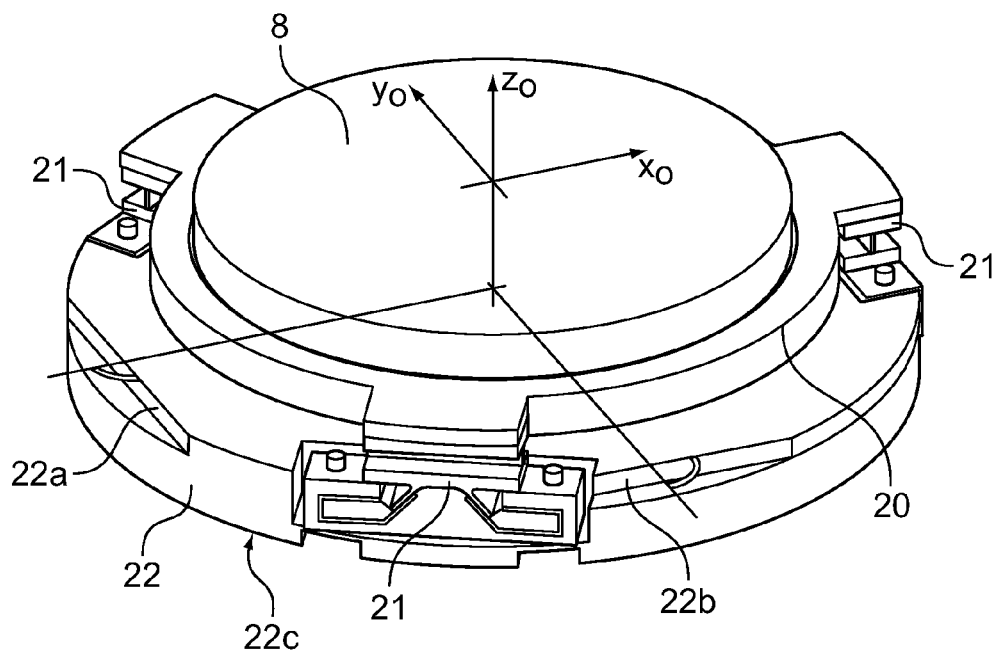
FIG. 2 shows a perspective view of an adjustment apparatus according to the invention.

As can be seen from FIG. 2, the optical elements, for example the lens 8, is mounted in an inner ring 20, which is connected to an external holder 22 via three adjustment devices 21. The three adjustment devices 21 bear the weight of the inner ring 20 and of the optical element, specifically of the lens 8. However, instead of the lens 8, it is, of course, also possible to mount a different optical element in the inner ring 20, for example a mirror.

The external holder 22 is firmly connected to adjacent external holders or to an objective structure, for example to the objective housing as shown in FIG. 1.

In this case, interfaces or reference surfaces 22a, 22b and 22c of the external holder 22 together with the external holders located adjacent to them or together with the objective housing 10 represent the reference geometry on the external holder 22, with respect to which the optical element 8 must be aligned. The reference surface 22a on the external holder 22 represents the $x_0$-direction, with the $x_0$-axis of the global coordinate system for this purpose being at right angles to the reference surface 22a. The $x_0$-position of the lens 8 with respect to the external holder 22 can be measured from the reference surface 22a.

The reference surface 22b rests on the outer holder 22 at right angles to the reference surface 22a. The reference surface 22b represents the $y_0$-axis in the global coordinate system and is at right angles to the reference surface 22b. The $y_0$-position of the optical elements, specifically the lens 8, can be measured from the reference surface 22b.

The reference surface 22c rests on the lower face of the external holder 22, and represents the $z_0$-axis of the global coordinate system. The $z_0$-axis represents the optical axis of the projection objective 7. The $z_0$-position and the tilt about the $x_0$-axis and $y_0$-axis, which are at right angles to the $z_0$-axis, of the lens 8 are measured from the reference surface 22c.

The reference surface 22c is also suitable for attachment of the external holder 22 to the objective structure.

The arrangements of the reference surfaces 22a, 22b and 22c as illustrated in FIG. 2 should, of course, be regarded only as examples. Within the scope of the invention, it is also possible to use other arrangements and reference surfaces which, for example, may also be based on polar coordinates.

Each adjustment device 21 is subdivided into a foot part 23, a center part 24 and a head part 25. In this case, the foot part 23 is firmly connected to the external holder 22, and the head part 25 is firmly connected to the inner ring 20.

As can be seen from FIG. 2 and the enlarged illustration in FIG. 3, each adjustment device 21 has an x-axis, a y-axis and a z-axis in a local coordinate system (related to the respective adjustment device).

The local z-axis is located on the connecting line between the head part 25, the center part 24 and the foot part 23. The x and y-axes lie on a plane at right angles to this. The z-axis is in general parallel to the optical axis.

A flexible and/or elastic first intermediate part 26 in the form of a connection or coupler like a leaf spring connects an adjusting element 27 to the foot part 23 such that it can pivot about the x-axis. For this purpose, the first elastic intermediate part 26 is oriented such that it allows bending about the x-axis. Adjustment screws 28, 29 can be used to set and fix the pivoting angle of the adjusting element 27 with respect to the foot part 23. As can be seen in particular from FIG. 3, the two adjusting screws 28, 29 are each held in threaded holes in the foot part 23. For this purpose, the foot part 23 in this area forms a U-shaped part, between whose limbs the adjusting element 27 is held. The adjusting element 27 can thus be clamped in between the ends of the two adjusting screws 28 and 29. The adjusting element 27 can be pivoted about an axis in the x-direction by movement of the adjusting screws 28, 29.

A flexible and/or elastic connection between the adjusting element 27 and the center part 24 is likewise provided by means of a second elastic intermediate part 30 in the form of a connection or coupler like a leaf spring. The second elastic intermediate part 30 is positioned at an angle α to the z-axis, and can be bent about the x-axis. Because the shaft, which bends easily, of the second elastic intermediate part 30 is oriented parallel to the local x-direction, it represents a connection of the adjusting element 27 to the center part 24, which can rotate about the x-axis and can at the same time move translationally at right angles to the plane of the elastic intermediate part or leaf spring 30.

In the same manner as in the case of the adjusting element 27 with the first intermediate part 26, a first flexible and/or elastic intermediate part 31, likewise in the form of a connection or coupler like a leaf spring, connects an adjusting element 32 to the foot part 23 such that it can pivot about the x-axis. For this purpose, the first elastic intermediate part 31 is oriented such that it allows bending about the local x-axis.

Once again, like the second intermediate part 30, a second elastic intermediate part 33 in the form of a connection or coupler like a leaf spring is used as a flexible connection between the adjusting element 32 and the center part 24. The second elastic intermediate part 33 is positioned symmetrically with respect to the second elastic intermediate part 30 at an angle α to the z-axis, and allows bending about the x-axis. Because the shaft, which bends easily, of the second elastic intermediate part 33 is oriented parallel to the x-axis, it represents a connection of the adjusting element 32 to the center part 24 which can rotate about the x-axis and is at the same time translational at right angles to the plane of the second elastic intermediate part 33, or the leaf-spring plane, of this part. The adjusting element 32 is fixed by means of adjusting screws 34 and 35 to the foot part 23, which is likewise U-shaped in this area, in the same way as the adjusting element 27. At the same time, the position of the adjusting element 32 is changed by an appropriate movement of the adjusting screws 34 and 35.

The described mounting and guidance of the adjusting elements 27 and 32 allows the center part 24 to be rotated with respect to the foot part 23 about an imaginary intersection axis of the extended planes of the second elastic intermediate parts or leaf springs 30 and 33. Because the shafts, which bend easily, of the second elastic intermediate parts 30 and 33 are in this case oriented parallel to the x-axis, the intersection axis which is formed by the planes of the second elastic intermediate parts 30 and 33, and thus also the rotation axis of the center part 24 with respect to the foot part 23, is likewise parallel to the x-axis.

The center part 24 is in turn connected by means of a third flexible and/or elastic intermediate part 36 in the form of a leaf spring to the head part 25 such the head part 25 can be moved in the x-direction with respect to the center part 24 by S-shaped bending of the third elastic intermediate part 36, and can be rotated about the y-axis by a single bending of the third elastic intermediate part 36. The head part 25 can be rotated about the z-axis with respect to the center part 24 by means of torsion on the third elastic intermediate part 36, which lies on the plane of the z-axis.

All the elastic intermediate parts 26, 30, 31, 33 and 36, which are in the form of leaf springs, are solid hinged joints which are thus in each case integral with the parts located adjacent to them and the adjacent parts connected to them. The leaf springs may, of course, also be separate parts.

The arrangement of the second elastic intermediate parts 30 and 33 with respect to the first elastic intermediate parts 26 and 31 allows rotation of the center part 24 and of the head part 25 with respect to the foot part 23, when the adjusting elements 27 and 32 are held firmly, about an intersection axis which is formed by the planes of the second elastic intermediate parts or leaf springs 30 and 33.

Since the center part 24 can be rotated about the x-axis with respect to the foot part 23, and the head part 25 can be moved linearly in the x-direction with respect to the center part 24 and can be rotated about the y-axis and about the z-axis, the head part 25 can also be moved linearly in the x-direction, and can be rotated about the x, y and z-axes, with respect to the foot part 23.

Figure 4:
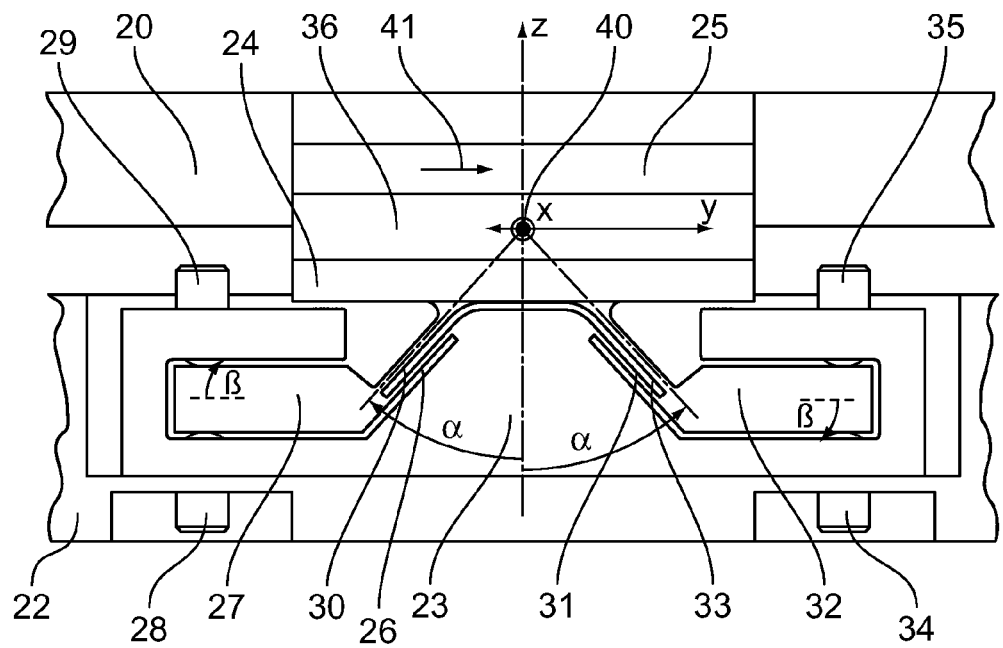
FIG. 4 shows a side view of the adjustment device shown in FIG. 2, illustrating a capability for movement in the y-direction.

In one kinematically highly advantageous refinement, the planes of the leaf springs or the planes of the second elastic intermediate parts 30 and 33 are positioned with their angles $\alpha$ with respect to the z-axis such that they intersect at a center point 40 of the leaf springs or of the third elastic intermediate part 36 (see FIG. 4). In this way, all three rotation axes of the head part 25 with respect to the foot part 23 pass through the center point 40 of the leaf spring or of the third elastic intermediate part 36. This refinement results in each adjustment device 21 fixing only two translation degrees of freedom in the y and z-directions per adjusting element 27 and 32 that is held firmly. The three adjustment devices 21 in this manner form a statically defined bearing for the inner ring 20, in a similar manner to that in the case of a hexapod with three translational and three rotational degrees of freedom. This is achieved in that two translational degrees of freedom can be adjusted per adjustment device, for example the local z-direction and the local y-direction.

The head part 25 can be moved in the y-direction and in the z-direction with respect to the foot part 23 for each adjustment device 21 by setting a pivot angle $\beta$ of the adjusting elements 27 and 32 by means of appropriate adjustment by the adjusting screws 28, 29, 34, 35. If the adjusting elements 27 and 32 are pivoted in the same sense, then this results in the head part 25 being moved in the y-direction with respect to the foot part 23 (see the arrow 41 in FIG. 4). If the adjusting elements 27 and 32 are pivoted in opposite senses, this results in the head part 25 being moved in the z-direction with respect to the foot part 23 (see the arrow 42 in FIG. 5).

Thus, as can be seen from FIG. 2, the optical element 8 can be moved in the $x_0$-direction and $y_0$-direction, and can be rotated about the $z_0$-axis, with respect to the external holder 22, by moving the head parts 25 of the adjustment devices 21 in their respective local y-direction.

A $z_0$ linear movement (optical axis) and tilts about the $x_0$-axis and $y_0$-axis of the optical element 8 with respect to the external holder 22 can be achieved by movement of the head part 25 of the adjustment device 21 in its respective local z-direction.

As can be seen, each adjustment device 21 thus comprises a foot part 23, two adjusting elements 27 and 32, a center part 24 and a head part 25, which are connected to one another via the elastic intermediate parts 26, 30, 31, 33 and 36 in the form of leaf springs as solid hinged joints.

When viewed in the respective local coordinate system, the elastic intermediate parts are in this case arranged such that:
1. the first elastic intermediate part 26 between the foot part 23 and the adjusting element 27 allows a rotational movement of the adjusting element 27 with respect to the foot part 23 about an axis parallel to the local x-direction,
2. the first elastic intermediate part 31 between the foot part 23 and the adjusting element 32 likewise allows a rotational movement of the adjusting element 32 with respect to the foot part 23 about an axis parallel to the local x-direction,
3. the second elastic intermediate part 30 connects the center part 24 to the adjusting element 27,
4. the second elastic intermediate part 33 between the adjusting element 32 and the center part 24 is positioned at an angle $2\alpha$ with respect to the second elastic intermediate part 30, as a result of which, when the adjusting elements 27 and 32 are fixed, the second elastic intermediate parts 30 and 33 together allow only a rotational movement of the center part 24 with respect to the foot part 23 about an axis parallel to the local x-direction, and
5. the third elastic intermediate part 36 allows movement of the head part 25 with respect to the center part 24 in the local x-direction, and rotation of the head part 25 with respect to the center part 24 about the local y-axis and the local z-axis.

The position of the two second elastic intermediate parts 30 and 33 at an angle $2\alpha$ with respect to one another, and symmetry with respect to the local z-axis for each angle $\alpha$ results in the adjustment device 21 having a symmetrical design. However, of course, it is also within the scope of the invention to choose different angle settings here.

The choice of the arrangement of the second elastic intermediate parts 30 and 33 in such a manner that the extended imaginary planes of these two elastic intermediate parts intersect at the center point 40 of the third elastic intermediate part 36 is kinematically advantageous.

As can also be seen from FIGS. 3 and 4, the most flexible bending axis of the third elastic intermediate part 36, which represents the y-rotational axis of the head part 25 with respect to the center part 24, and the torsion axis of the third elastic intermediate part 36, which represents the z-rotation axis of the head part 25 with respect to the center part 24, passes through the center point 40 of the third elastic intermediate part 36. In this way, the x-axis, y-axis and z-axis of the head part 25 with respect to the foot part 23 intersect at the center point 40 of the third elastic intermediate part 36, which is like a leaf spring.

Figure 6:
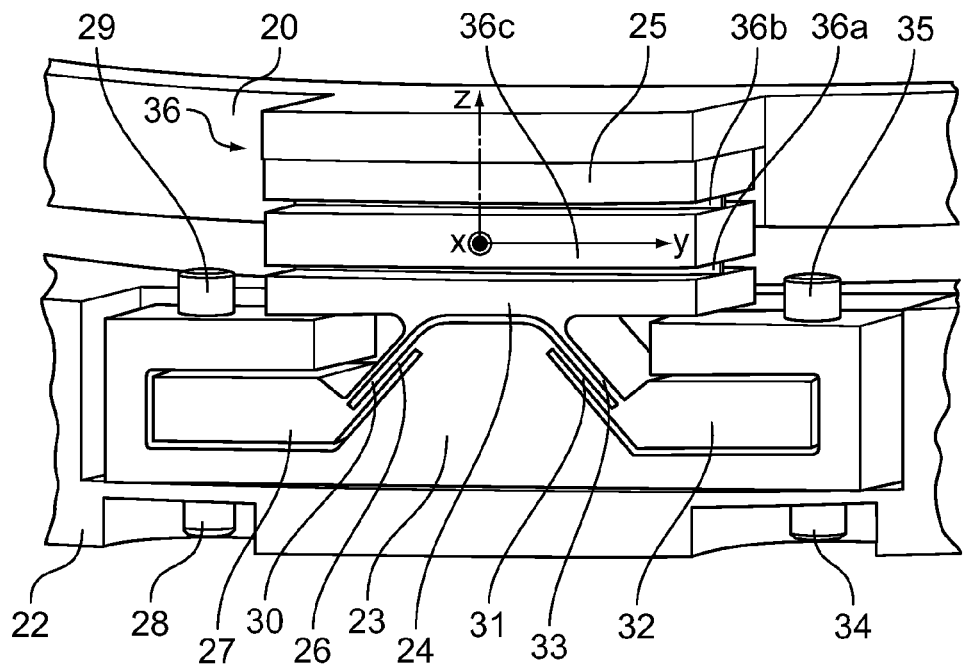
FIG. 6 shows a side view of a second embodiment of the adjustment device shown in FIG. 3.

FIG. 6 shows a refinement of the third elastic intermediate part 36 in which the third elastic intermediate part 36 is formed by two short leaf-spring joints 36a and 36b, which can each be tilted about an axis parallel to the y-direction. The two leaf-spring joints 36a and 36b are separated from one another by a center piece 36c. This refinement increases the stiffness in the z-direction without decreasing the translational flexibility in the x-direction. The longitudinal or bending axes of the leaf-spring joints 36a and 36b and those of the center piece 36c run in the y-direction.

However, the refinement according to FIG. 6 somewhat restricts the desired z-rotation mobility of the head part 25 with respect to the center part 24. For this reason, the exemplary embodiment shown in FIG. 7 proposes that the center piece 36c be provided between the two leaf-spring joints 36a and 36b with slots 43 which preferably run in the z-direction. The slots 43 may be formed virtually continuously as far as the center, or else may represent only short incisions. As can be seen from FIG. 7, a large number of slots 43 are arranged parallel alongside one another, and the slots 43 can extend as far as the leaf-spring joints 36a and 36b. This refinement once again results in high rotational mobility in the z-direction.

Figure 7:
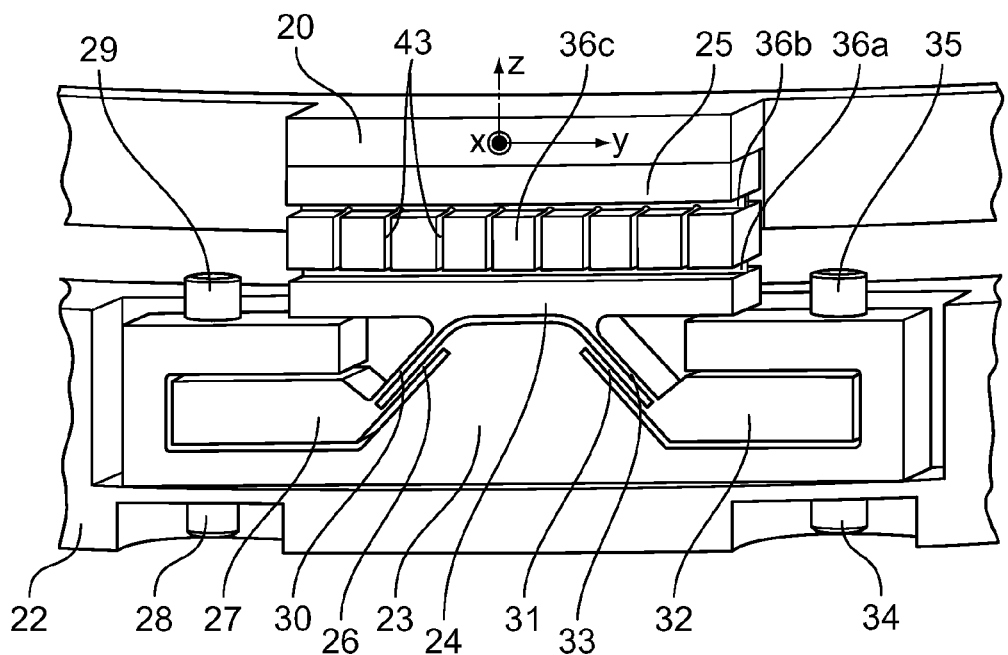
FIG. 7 shows a side view of a third embodiment of the adjustment device shown in FIG. 3.
Figure 8:
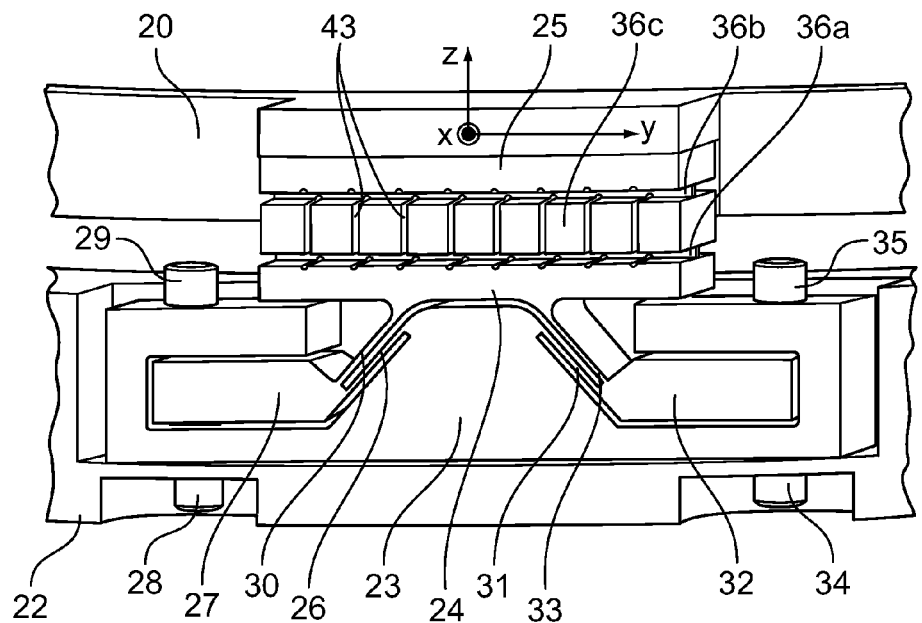
FIG. 8 shows a side view of a fourth embodiment of the adjustment device shown in FIG. 3.

A further embodiment, which is illustrated in FIG. 8, also makes it possible to provide for not only the center piece 36c but also the leaf-spring joints 36a and 36b to be provided with slots 43. This measure can be implemented in addition to or else independently of the refinement as shown in FIG. 7 with the slots 43. As can be seen, this results in a large number of small leaf springs or elastic intermediate parts which are arranged one behind the other in the y-direction.

Figure 9:
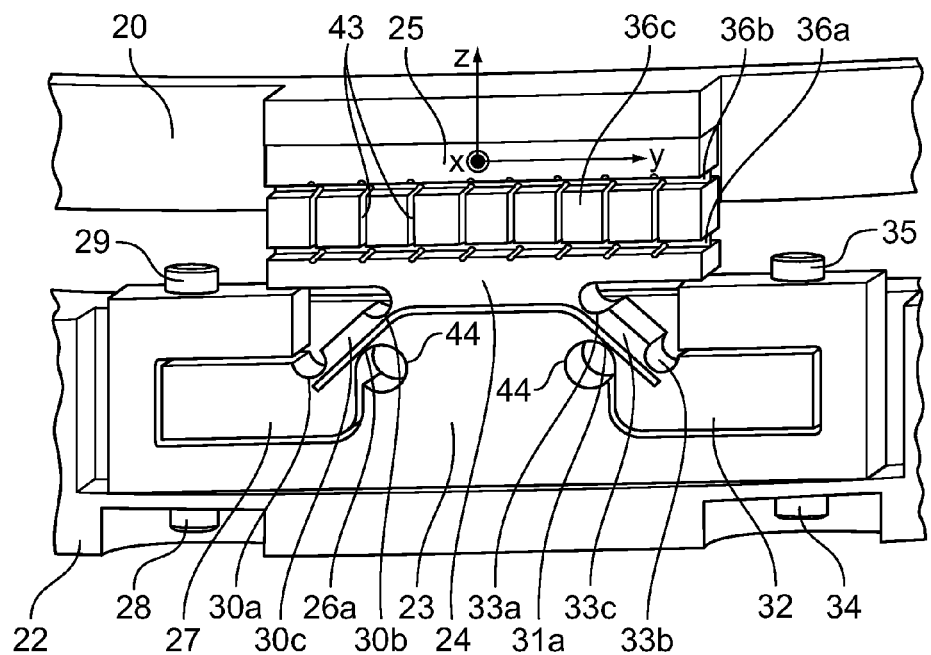
FIG. 9 shows a side view of a fifth embodiment of the adjustment device shown in FIG. 3.

As can be seen from FIG. 9, the first elastic intermediate parts 26 and 31, which are like leaf springs, may each be replaced by a short tilting joint 26a and 31a, respectively. As can be seen, this is achieved by in each case one circular aperture 44 in the foot part 23, with the position of the circular aperture 44 in each case being chosen such that this results in a constriction in the first intermediate part 26 or 31, respectively, and thus the tilting joint 26a or 31a, respectively.

As can also be seen from FIG. 9, the two second elastic intermediate parts 30 and 33, which are like leaf springs, can each be replaced by two short tilting joints, specifically in each case one lower tilting joint 30a and 33b and in each case one upper tilting joint 30b and 33a, which are each separated by a connecting part 30c, 33c. In this case as well, the tilting joints are each formed by circular apertures or incisions in the elastic intermediate parts, which in this way form defined and short constrictions, and thus act as tilting joints.

Figure 10:
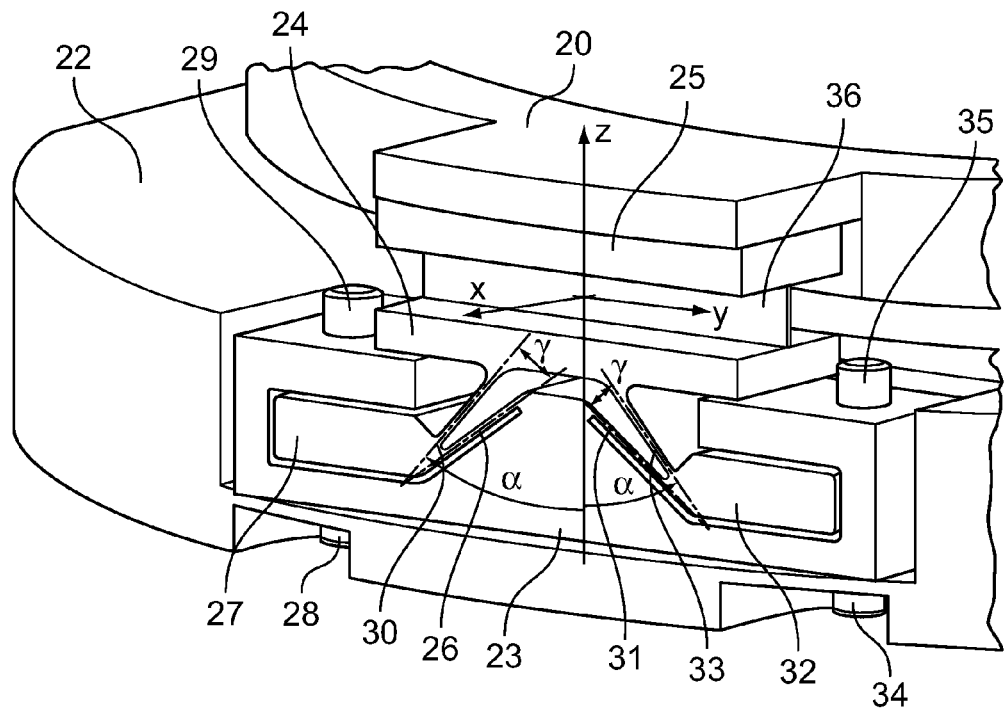
FIG. 10 shows an enlarged illustration of a similar embodiment of an adjustment device to that shown in FIG. 3.
Figure 11:
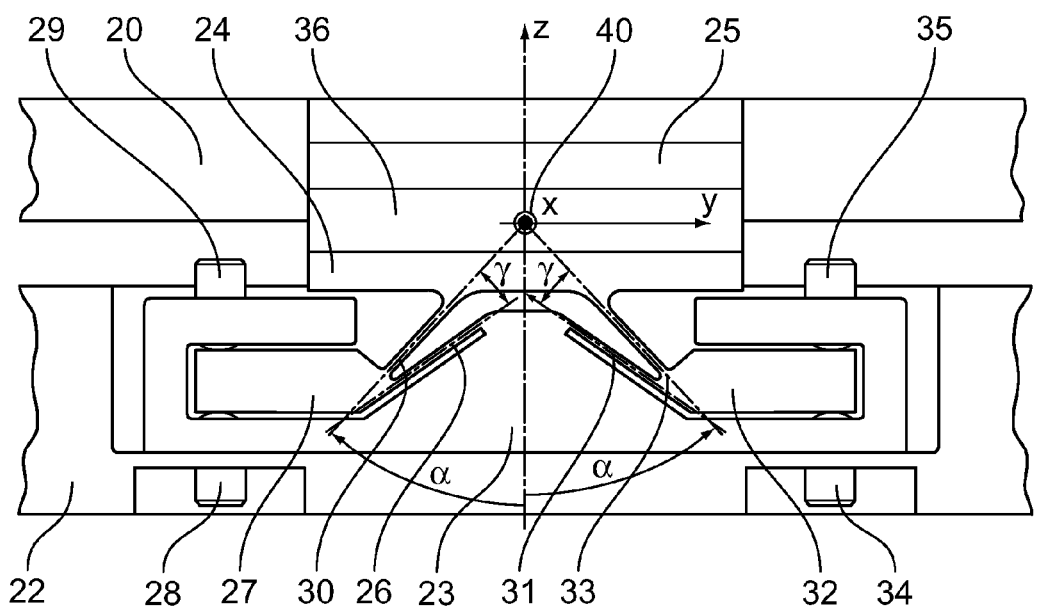
FIG. 11 shows a side view of the adjustment device as shown in FIG. 10.

As elastic intermediate parts, the leaf springs 26 and 30 need not be parallel to one another, as illustrated in FIGS. 3 and 4, but could also be at an angle to one another. This also applies to the leaf springs 31 and 33 as elastic intermediate elements. A refinement such as this, in each case with an angle γ which opens from the adjusting elements 27 and 32 in the direction of the center part 24, can be seen in FIGS. 10 and 11.

Figure 12:
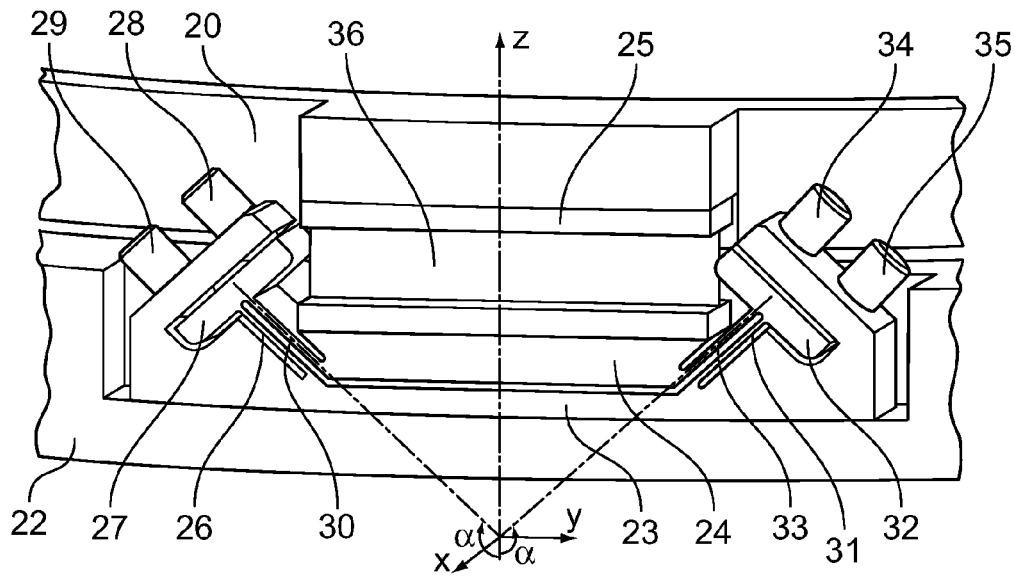
FIG. 12 shows an enlarged perspective illustration of a similar refinement of an adjustment device to that shown in FIG. 3, with angles α which are greater than 90 degrees.

FIG. 12 shows a refinement of an adjustment device 21 which results in a very small physical height in the z-direction. As can be seen from the Figure, the two angles α in this case each correspond to an angle α of the leaf springs 26 and 31 as first elastic intermediate parts which is in each case greater than degrees to the z-axis. In this case, the intersection of the planes of the leaf springs 30 and 33 as second intermediate parts with the z-axis may be located outside the leaf spring 36 as a third intermediate part, so that the local x and y-axes of the adjustment device 21 are also located outside the leaf spring 36.

However, for kinematics which are as advantageous as possible, the intersection of the planes of the leaf springs 30 and 33 as second intermediate parts with the z-axis should as far as possible be located in the center of the leaf spring 36 which forms the third elastic intermediate part.

The adjustment device 21 illustrated in FIG. 12 may also be formed from a plurality of pieces. For this purpose, for example, the leaf spring 36 is attached by the head part 25 as a separate part to the center part 24.

The refinement with the angle α being greater than 90 degrees results in the adjusting screws 28 and 29, as well as 34 and 35, not being arranged on opposite sides of the adjusting elements 27 and 32, but in each case being located alongside one another, at a distance from one another, in which case they are in each case located on opposite sides of the leaf-spring plane 26 or 31, respectively, for operation of the respectively associated adjusting elements 27 and 32.

Figure 13:
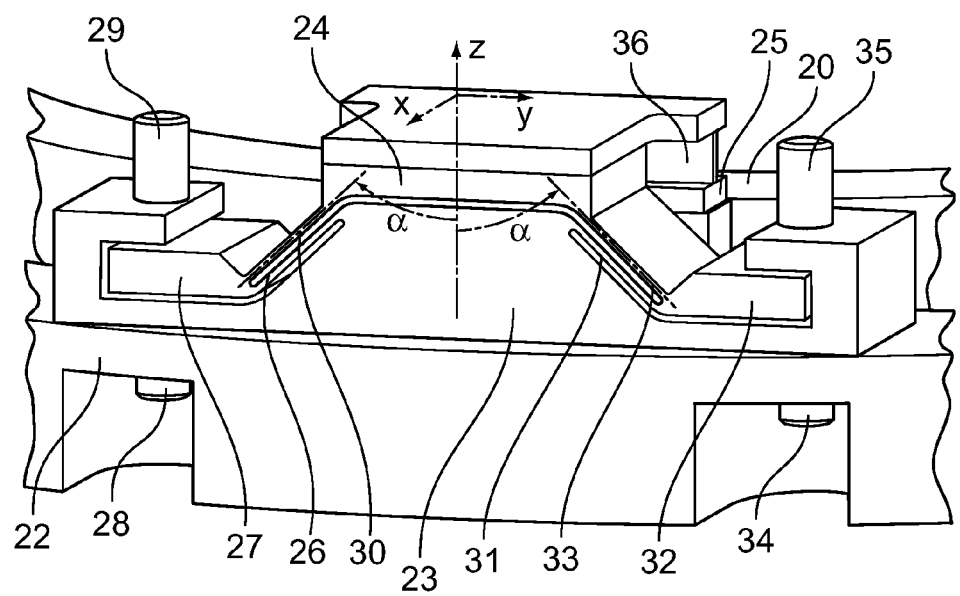
FIG. 13 shows an enlarged perspective illustration of a further embodiment of an adjustment device with a very small physical height in the z-direction.

A further possible way to save physical height in the z-direction is illustrated in FIG. 13. For this purpose, the leaf spring 36 as the third elastic intermediate part is arranged with the head part 25 offset inwards in the x-direction with respect to the foot part 23 with the leaf springs 26, 30 and 31, 33 as the first and second intermediate parts and the adjusting levers 27 and 32. For this reason, the third elastic intermediate part 36 points downwards in a corresponding manner, and the head part 25 is located underneath (with respect to the foot part 23). This refinement allows the head part 25 to be arranged offset in the x-direction at the same physical z-height alongside the foot part 23.

In FIG. 13 as well, the adjustment device 21 is, for example, formed from a plurality of parts, with the location of the joint between the parts running in the center part 24.

Figure 14:
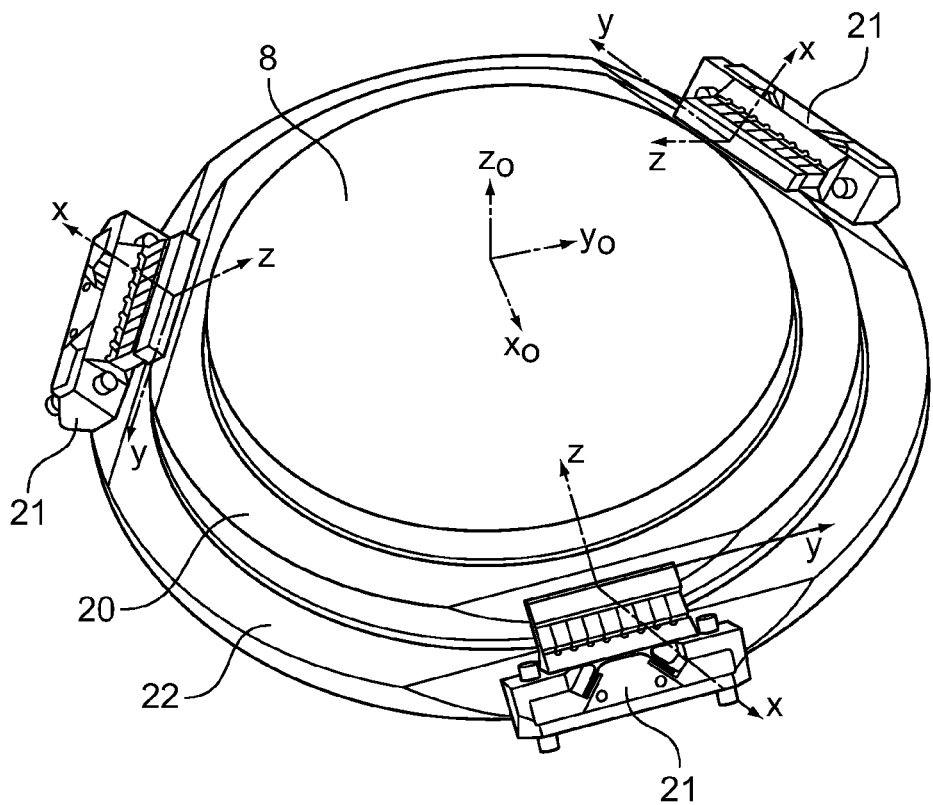
FIG. 14 shows a perspective view of an adjustment apparatus as shown in FIG. 2 from above with adjustment devices which are inclined with respect to the optical axis.
Figure 15:
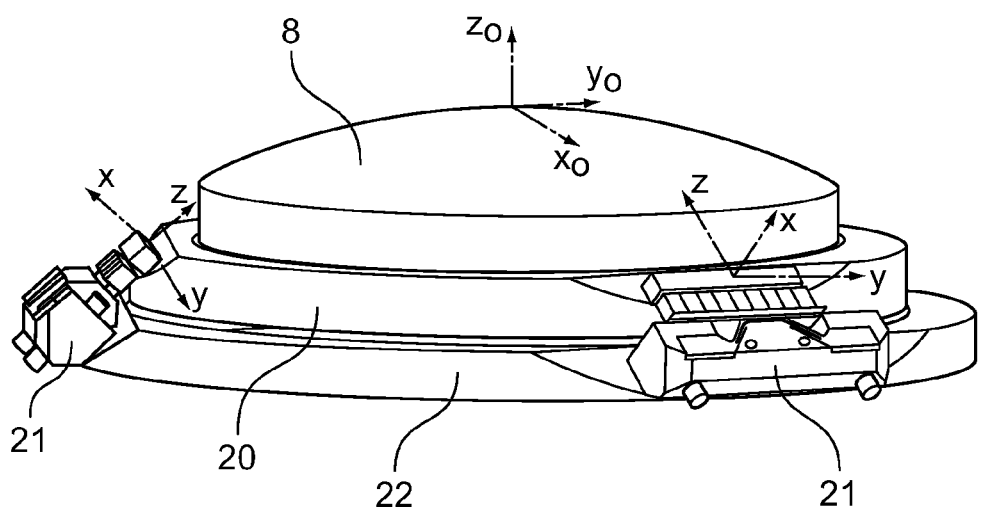
FIG. 15 shows a perspective view of an adjustment apparatus as shown in FIG. 10 from the side with adjustment devices which are inclined with respect to the optical axis.

As can be seen from FIGS. 14 and 15, the local z-axes of the three adjustment devices 21 need not only be arranged parallel to the global $z_0$-axis (optical axis), but can also be inclined with respect to it.

Other adjustment elements may, of course, also be provided for adjustment and fixing of the adjusting elements 27 and 32, instead of adjusting screws 28, 29, and 35, such as electromagnetic, piezo-actuator, pneumatic, magnetostrictive, hydraulic drives and similar mechanical motor drives.

Figure 16:
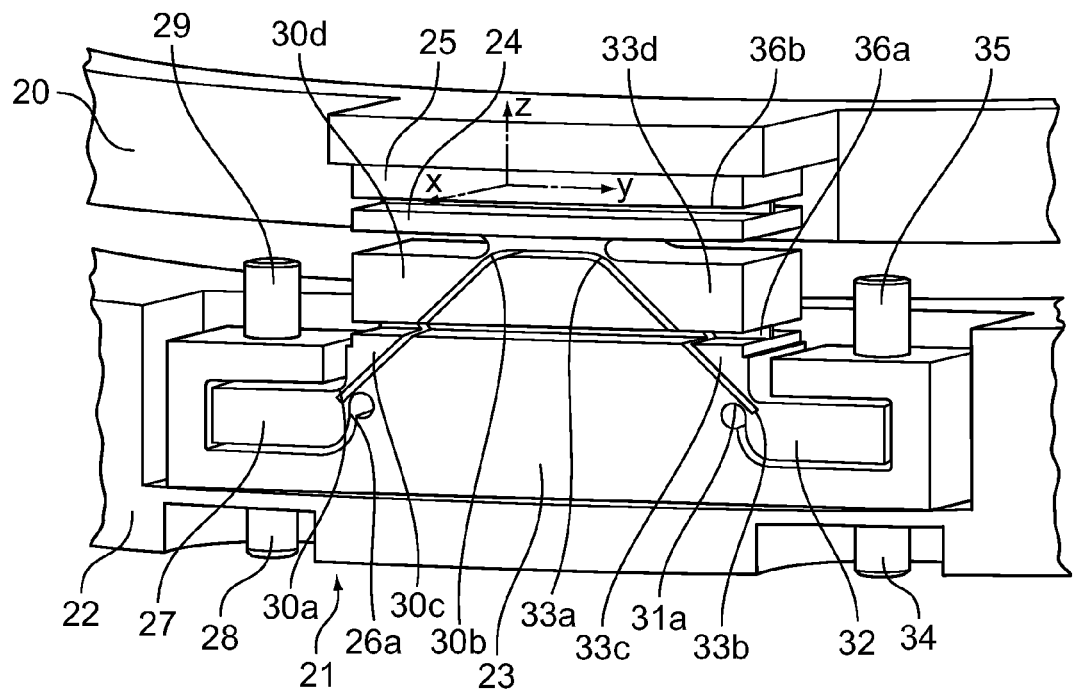
FIG. 16 shows an enlarged perspective illustration of a further embodiment of an adjustment device, in which the optical element need not be rotated about the optical axis.

FIG. 16 shows one exemplary embodiment of an operational situation which is particularly advantageously of interest for rotationally symmetrical optical elements when the optical element 8 need not be rotated for adjustment about the $z_0$-axis (optical axis), so that the angle of the optical element 8 about the $z_0$-axis is always reset to zero if rotation about the $z_0$-axis also occurs at the same time during linear movement by means of an adjustment device. Fundamentally, the illustrated example embodiment shown in FIG. 16 is designed in the same way as the exemplary embodiments shown in FIGS. 6 to 9, so that the same reference symbols have also been retained in this case. In the same way as in the case of the exemplary embodiments shown in FIGS. 6 to 9, the third intermediate part 36 is also subdivided into two parts in this case, specifically into two leaf-spring joints 36a and 36b.

If the optical element 8 need be moved translationally only in the $x_0$, $y_0$ and $z_0$-directions, and need be tilted only about the $x_0$ and $y_0$-axes, while the rotation angle about the $z_0$-axis is always maintained at zero, the optical element 8 need be adjusted in only five degrees of freedom, rather than in six degrees of freedom.

If, in this case, the local z-axes of the adjustment devices 21 are parallel to the $z_0$-axis of the optical element 8, as is illustrated in FIGS. 2 and 3, and if the optical element 8 is not rotated about the $z_0$-axis, the rotational mobility of the head part 25 with respect to the foot part 23 about the local z-axis can be restricted without any major adverse effects on operation.

In the exemplary embodiments illustrated in FIGS. 2 to 13, the head part 25 can be moved translationally in the x-direction with respect to the foot part 23 by means of the adjustment devices 21, and can be tilted about the x, y and z-axes, with this mobility being made possible by the moving intermediate parts.

Subject to the conditions described above (no rotation about the $z_0$-axis of the optical element 8 and parallelity of the local z-axes with respect to the $z_0$-axis), adjustment devices 21 can be used whose head part 25 can be moved translationally in the x-direction and can be tilted only about the x and y-axes, with respect to the foot part 23. The capability to rotate about the z-axis can be restricted in this case. This embodiment is illustrated in FIG. 16.

Since the mobility of the head part 25 with respect to the foot part 23 is provided by the moving intermediate parts whose mobility is, however, not force-free but which is dependent on force, "parasitic" forces during adjustment of the adjustment devices 21 result in deformation of the inner ring 20, which can also be transferred to the optical element 8, thus leading to undesirable imaging errors.

This disadvantageous deformation of the inner ring 20 and/or of the optical element 8 may, however, be reduced by in each case making the elastic intermediate parts 26, 31, 30, 33 and 36 softer in the directions in which they move.

In this sense, the exemplary embodiment shown in FIG. 16 is a further development of the embodiment illustrated in FIG. 9, in which better x-translation mobility is achieved at the expense of z-rotation mobility of the head part 25 with respect to the foot part 23.

In order to achieve this better x-translation mobility of the head part 25 with respect to the foot part 23, the distance between the leaf-spring joints 36a and 36b of the third elastic intermediate part 36 is increased in the z-direction.

As can be seen, of the two leaf-spring joints 36a and 36b, one leaf-spring joint, as the upper leaf-spring joint 36b, is arranged between the center part 24 and the head part 25, and the other leaf-spring joint, as the lower leaf-spring joint 36a, is arranged between the center part 24 and the foot part 23. Both leaf-spring joints 36a and 36b can rotate and be tilted about the x-axis. This refinement in each case results in the lower leaf-spring joint 36a being arranged between the lower and upper tilting joints 30a, 33b and 30b, 33a.

The lack of the slots 43 in the center piece 36c or the center, part 24 increases the rotation resistance of the head part 25 with respect to the foot part 23 about the z-axis. However, in the exemplary embodiment shown in FIG. 16, this is not associated with any adverse effects on operation.

The movement of the leaf-spring joint 36a to a position below the two upper tilting joints 30b and 33a results in the connecting part 30c in each case being split into two parts, that is to say the connecting parts 30c and 30d, and the connecting part 33c being split into two parts, that is to say the connecting parts 33c and 33d. In this case, the center part 24 then connects the leaf-spring joint 36b to the tilting joint 30b and to the tilting joint 33a.

Figure 5:
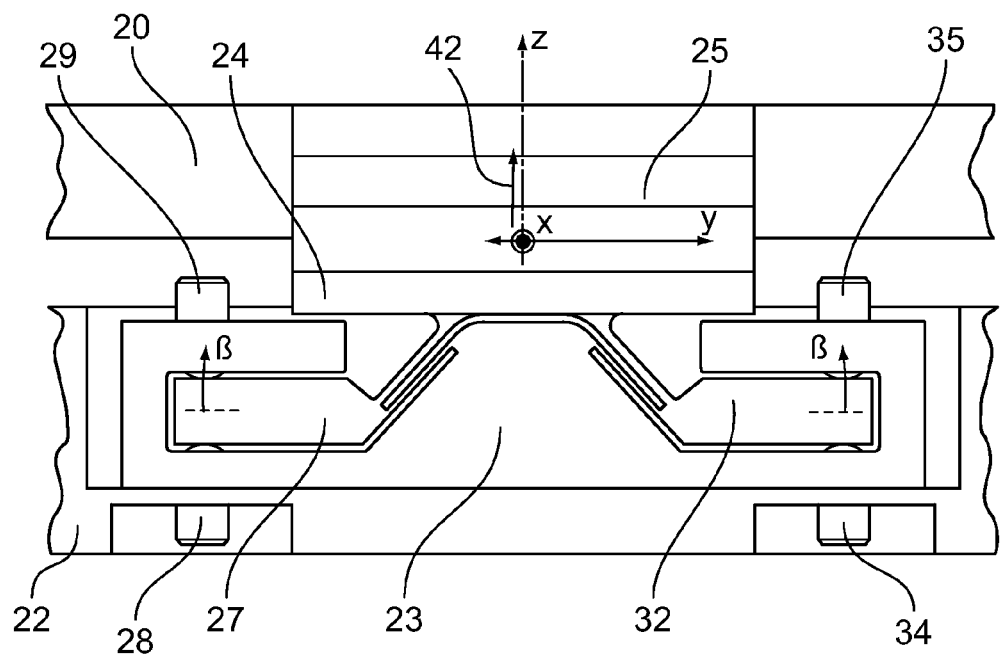
FIG. 5 shows a side view of the adjustment device shown in FIG. 4, illustrating a capability for movement in the z-direction.
Figure 17:
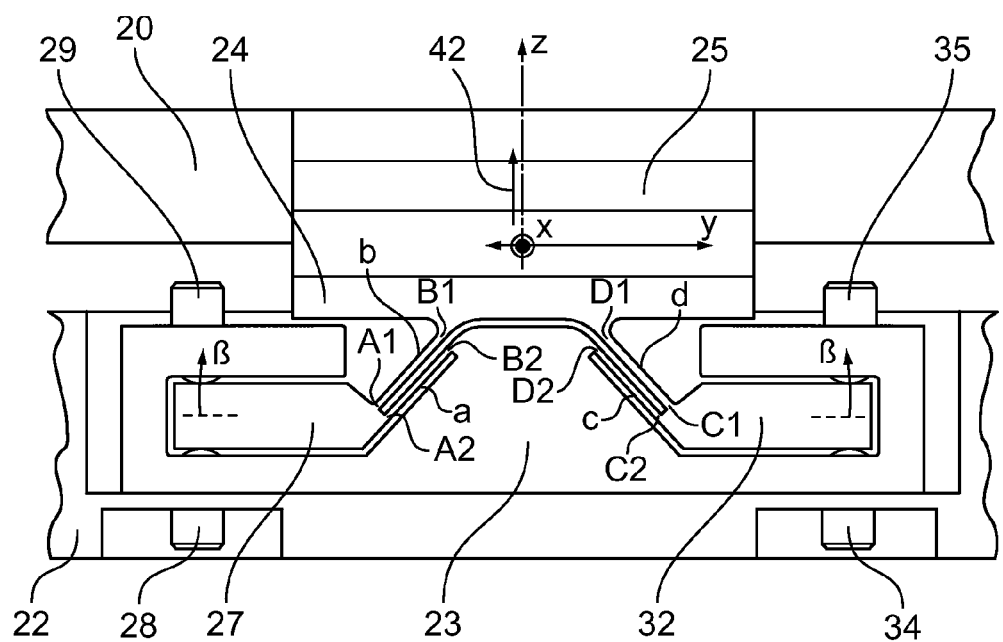
FIG. 17 shows a side view of the adjustment device which corresponds to the adjustment device shown in FIG. 5, in which additional details relating to the levers, which are like leaf springs, and the rotation axes are shown, for explanatory purposes.

FIG. 17 shows the exemplary embodiment of an adjustment device as illustrated in FIG. 5, with additional statements having been made in order to explain the subsequent figures, which relate to a positioning unit. The connection, which is in the form of a leaf spring and interacts with the adjusting element in the form of an adjusting lever 27, is illustrated in this figure as a coupler a with the rotation points A2 and B2, with the rotation point or rotating joint A2 producing the connection to the adjusting lever 27, and the rotational point or the rotating joint B2 producing the connection to the foot part 23. A coupler b is located between the rotating joints A1 and the adjusting lever 27, and the rotating joint B1 and the center part 24. The same applies to the coupler c, which is located between the rotating joint C2 and the adjusting element 32, and the rotating joint D2 to the foot part 23 and the coupler D, which is located between the rotating joint C1 and the adjusting lever 32, and between the rotating joint D1 and the center part 24.

FIG. 18 shows an embodiment in which the distances between A1 and B1, A2 and B2, C1 and D1 as well C2 and D2 in each case shrink to zero and in which the couplers a, b, c and d now only form spring joint pairs.

Where the parts described in these figures and in the following figures correspond to the parts illustrated in FIGS. 2 to 16, the same reference symbols have been adopted for them as well. Each positioning unit or adjustment device 21 once again has an x-axis, a y-axis and a z-axis in a local coordinate system, with the y-axis being oriented in the tangential direction, and the z-axis being oriented in the axial direction.

The external holder 22 is firmly connected to adjacent holders or to an objective structure, with the optical element 8 together with the three adjustment devices 21 being positioned and adjusted with respect to the external holder 22, or the rest of the objective structure.

Each of the three adjustment devices 21 supports the inner ring 20 together with the optical element 8 only in the tangential direction, that is to say in the y-direction, and in the axial direction, that is to say in the z-direction, so that the three adjustment devices 21 together result in a statically defined mounting for the inner ring 20 and thus also for the optical element 8, because the six degrees of freedom of the inner ring 20 are supported by in each case two forces per adjustment device 21.

Each adjustment device 21 is subdivided into the foot part 23, one or more center parts 24a, 24b, 24c, the head part 25 and the two adjusting levers 27 and 32, which are connected to one another via tilting-spring joints 45a, 46a, 45b, 46b.

In order that only one force is transmitted in the y-direction and in the z-direction per adjustment device 21, the head part 25 must be translationally flexible with respect to the foot part 23 in the x-direction, and must be capable of tilting about the x, y and z-axes.

The adjusting lever 32 is in this case mounted by means of a tilting-spring joint 45a, whose tilting axis is oriented parallel to the x-axis, such that it can rotate in the foot part 23, in which case the angle of the adjusting lever 32 with respect to the foot part 23 can be set and fixed by means of the adjusting screws 34 and 35. A tilting-spring joint 46a which is offset with respect to the tilting-spring joint 45a in the y-direction and is arranged parallel to it connects the adjusting lever 32 to the center part 24a. The two tilting axes of tilting-spring joints 47 and 48 which are oriented in the y-direction and are offset in the z-direction allow the center part 24c to be moved translationally in the x-direction and to be tilted about the y-axis with respect to the center part 24a, thus also allowing the head part 25 to be moved translationally in the x-direction, and to be tilted by a y-axis, with respect to the foot part 23. A tilting-spring joint 49, whose tilting axis is oriented parallel to the x-axis, connects the center part 24c to the head part 25, so that the head part 25 can be tilted about the x-axis with respect to the center parts 24 and thus also with respect to the foot part 23.

A (slight) rotational flexibility of the head part 25 with respect to the foot part 23 can be achieved by torsion of the tilting-spring joints 47, 48 and 49. The head part 25 of each adjustment device 21 can thus be moved translationally in the x-direction, and can be tilted about the x, y and z-axes, with respect to the foot part 25.

In order to allow the optical element 8 to be moved in all six degrees of freedom with respect to the external holder 22, it must be possible to move the head part 25 on the yz-plane with respect to the foot part 23 for each of the three adjustment devices 21, in the same way, for example, as in the case of a hexapod principle, or a Stuart platform.

FIG. 19 illustrates the adjustment options (which will be explained in more detail in the following text) in an outline illustration with the two adjusting levers 27 and 32 as levers, and the tilting-spring joints 45a, 46a and 45b, 46b. The two adjusting levers 27 and 32 each have a respective force arm 27a and 32a, on which the respective adjusting screws 28 and 29 as well as 34 and 35 act as adjusting elements or actuators. The tilting-spring joints 45a and 45b represent the lever bearings for the adjusting levers 27 and 32. The tilting-spring joints 46a and 46b form the coupling points to the centre point 24. A first connecting area A (head part 25) for connection to the optical element, and a second connecting area B (foot part 23) for connection to an object in the vicinity of the optical element, in this case to the holder 22, and the intermediate element C (center part 24) which acts on the two tilting-spring joints 46a and 46b form a framework.

On deflection of one or else both force arms 27a and 32a with in each case one rotational point about the respectively associated lever bearing 45a and 45b, the framework is deflected in a corresponding manner via the two load arms 27b and 32b of the two adjusting levers 27 and 32. If operated on one side, as illustrated by the actuator 29, this results in the connecting area A (end part 25) being tilted on a circular arc. If the two adjusting levers 27 and 32 are operated at the same time, this results in a lifting or lowering movement of the connecting area A along the z-axis. The hinged joints which are associated with the two adjusting levers 27 and 32 have approximately parallel rotation axes which, in a first position, lie approximately on a plane. In the position illustrated in FIG. 19, this is the basic position, while the dashed illustration represents a deflected, second position.

As can be seen, in the basic position, the approximately parallel rotation axes lie at least approximately on a plane, with the center part 24a, on which the two tilting-spring joints 46a and 46b act, being located in between. The distance between the rotation axes of the two adjusting levers, in each case between the rotation axes and, respectively, tilting-spring joints 45b and 46b as well as 45a and 46a, respectively, is less than 0.1 times, and preferably less than 0.01 times, the lever distance of the force arm (distance between the actuators 28/29 and the tilting-spring joint 45b as the lever bearing, or the two actuators 34/35 and the tilting-spring joint 45a as the lever bearing). Alternatively or additionally, the maximum distance between the plane which is covered by the rotation axes of the two adjusting levers 45a and 45b and a plane which is covered between the tilting-spring joints 46b and 46a is less than 0.1 times, and preferably less than 0.01 times, the distance between the rotation axes 45a, 45b of the two adjusting levers 27 and 32.

Figure 20:
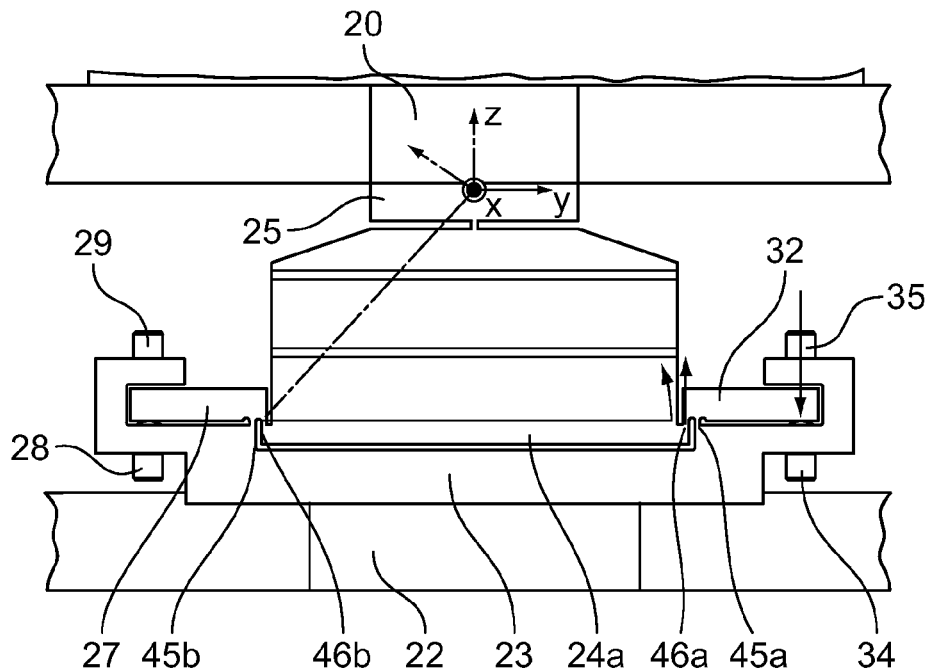

If, according to the embodiment shown in FIG. 20, the adjusting lever 32 is moved by means of the adjusting screws 34 and 35 with respect to the foot part 23, then the adjusting lever 32 is tilted about the tilting-spring joint 45a, with the tilting-spring joint 46a being raised or lowered owing to the y-offset with respect to the tilting-spring joint 45a in the z-direction—depending on the direction in which the adjusting lever 32 is tilted.

Since the z-movement of the tilting-spring joint 46a is transmitted to the center part 24a, while on the other hand the center part 24a is held fixed on the tilting-spring joint 46b by means of the adjusting lever 27, the center part 24a has to rotate about the tilting-spring joint 46b. This rotation results in the head part 25 carrying out a pivoting movement on the yz-plane, to be precise likewise about the tilting-spring joint 46b.

When the adjusting lever 27 is tilted as shown in FIG. 21, this results in a pivoting movement, reflected with respect to the z-axis, of the head part 25, as is caused by tilting of the adjusting lever 32 as shown in FIG. 5.

A y-movement or a z-movement of the head part 25 with respect to the foot part 23 may be composed of a linear combination of the two pivoting movements shown in FIGS. 5 and 6.

The structures according to the invention result in a solid-joint measurement which is highly resistant to shock and is at the same time highly stiff, so that the optical element 8 cannot as easily be excited to carry out undesirable oscillations. Stiffer actuators and manipulators can be provided in particular in the y and z directions, with greater flexibility in the other directions. This is important, for example, in order to allow compliance with the dynamic requirements for large, heavy optical elements, such as mirrors.

It is not absolutely essential for the head part 25 to be able to rotate with respect to the foot part 23 about the z-axis if the optical element 8 need not be rotated about the z-axis.

Instead of a connection of the head part 25 to an internal holder 20, it is, of course, also possible for the head part 25 to be attached directly to the optical element 8.

FIG. 22 shows an embodiment in which the center part 24b is subdivided by means of separating cuts in the z-direction between the tilting-spring joints 47 and 48, whose tilting axis is oriented parallel to the y-axis, in order to achieve greater rotation flexibility about the z-axis.

For clarity reasons and for simplification, only the reference symbols for the most important parts and for the new features are indicated in FIG. 22 and in FIGS. 23 to 29, which will be described in the following text.

FIG. 23 illustrates an embodiment in which the tilting-spring joints 47 and 48 and the center part 24b are replaced by a leaf spring 50, whose plane lies on the yz-plane.

Figure 24:
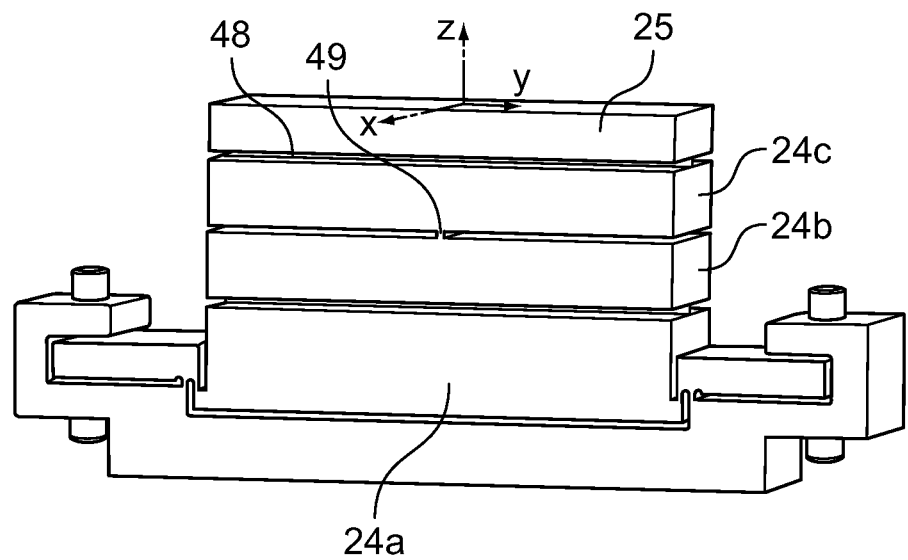

Various combinations and arrangements are possible for the spring joints between the center part 24a and the head part 25, provided that these allow the head part 25 to be moved translationally in the x-direction and to be tilted about the y-axis and z-axis with respect to the center part 24a. For example, as shown in FIG. 24, the positions of the tilting-spring joints 48 and can thus be interchanged in comparison with the embodiment shown in FIG. 18.

In the same way, as shown in the embodiment in FIG. 25, the positions of the tilting-spring joints 47 and those of the tilting-spring joint 48 can likewise be interchanged.

As can be seen from FIG. 26, the tilting-spring joint 49 can be stiffened in the y-direction by additionally connecting the head part 25 to the center part 24c via a hinged-joint coupler, comprising the hinged joints 491a, 491b and a center piece 491c, with the hinged-joint planes of the hinged joints 491a and 491b intersecting the hinged-joint plane of the tilting-spring joint 49 on the tilting axis of the head part 25 with respect to the center part 24c.

The head part 25 can be connected to the center part 24c via a further hinged-joint coupler, comprising the hinged joints 492a, 492b and a center piece 492c, with the hinged-joint planes of the hinged joints 492a and 492b intersecting the hinged-joint plane of the tilting-spring joint 49 on the tilting axis of the head part 25 with respect to the center part 24c.

The hinged-joint couplers comprising the hinged joints 491a, 491b and the center piece 491c can also be replaced by a leaf spring (not illustrated), with the plane of the leaf spring intersecting the hinged-joint plane of the tilting-spring joint 49 on the tilting axis of the head part 25 with respect to the center part 24*c*.

The hinged-joint coupler, comprising the hinged joints 492*a*, 492*b* and the center piece 492*c*, can likewise be replaced by a leaf spring (not illustrated), with the plane of the leaf spring intersecting the hinged-joint plane of the tilting-spring joint 49 on the tilting axis of the head part 25 with respect to the center part 24*c*.

As can be seen from FIG. 27, the tilting-spring joint 45*a* can be reinforced by a hinged joint 451 while retaining the original tilting axis of the tilting-spring joint 45*a*, by the planes of the tiling-spring joints 45*a* and 451 intersecting on the tilting axis of the tilting-spring joint 45*a*.

The tilting-spring joint 45*b* can be reinforced by means of a hinged joint 452 while retaining the original tilting axis of the tilting-spring joint 45*b*, by the planes of the hinged joints 45*b* and 452 intersecting on the tilting axis of the tilting-spring joint 45*b*.

FIG. 28 shows how the tilting-spring joint 46*a* can be reinforced by a hinged joint 461 while retaining the original tilting axis of the tilting-spring joint 46*a*, by the planes of the hinged joints 46*a* and 461 intersecting on the tilting axis of the tilting-spring joint 46*a*.

The tilting-spring joint 45*b* can be reinforced in the same way by a hinged joint 462 while retaining the original tilting axis of the tilting-spring joint 46*b*, by the planes of the hinged joints 46*b* and 462 intersecting on the tilting axis of the tilting-spring joint 46*b*.

According to the exemplary embodiment shown in FIG. 29, the adjustment device 21 can be stiffened by connecting the center part 24*a* to the foot part 23 in the y-direction by means of a hinged-joint coupler, comprising the hinged joints 241*a*, 241*b* and the center piece 241*c*, in which case the plane of the hinged joints 241*a* and 241*b* should lie approximately on a straight line which is formed by the tilting-spring joints 45*a*, 45*b*, 46*a* and 46*b*.

The center part 24*a* can also be connected to the foot part 23 via a further hinged-joint coupler, comprising the hinged joints 242*a*, 242*b* and the center piece 242*c*, in which case the plane of the hinged joints 242*a* and 242*b* should lie approximately on a straight line which is formed by the tilting-spring joints 45*a*, 45*b*, 46*a* and 46*b*.

The hinged-joint coupler comprising the hinged joints 241*a*, 241*b* and the center piece 241*c* can also be replaced by a leaf spring (not illustrated), in which case the plane of the leaf spring should lie approximately on a straight line which is likewise formed by the tilting-spring joints 45*a*, 46*a*, 45*b*, 46*b*.

In the same way, the hinged-joint coupler comprising the hinged joints 242*a*, 242*b* and the center piece 242*c* can be replaced by a leaf spring (likewise not illustrated), in which case the plane on this leaf spring should likewise lie approximately on a straight line which is likewise formed by the tilting-spring joints 45*a*, 46*a*, 45*b*, 46*b*.

FIG. 30 shows an enlargement of a detail of the lever 26 which is like a leaf spring and is connected to the foot part 23, and of the lever 30 which is like a leaf spring and is connected to the center part 24. As can be seen, a stiffening element 52 for adjustment of the stiffness of the hinged-joint connection is located in the gap 51 between the two levers 26 and 30, which are like leaf springs. The stiffening element 52 may, for example, be a piezo-element which can be activated electrically and is arranged with play in the gap 51 when not activated. When the piezo-elements are activated, the stiffening element 52 is "thickened", so that the gap 51 is bridged, so that the play is changed by higher stiffness, until the play is completely changed by closure of the gap.

At least one of the lever bearings 45*a*/45*b* and/or one tilting-spring joint 46*a*/46*b* of the two load arms 32*b* or 27*b*, respectively, of the two adjusting levers 32 and 27 may be designed such that, when the levers are deflected, the lever bearings carry out a rolling movement along a curved path, which is designed to be relatively stiff in comparison to at least one connecting area A, B or the intermediate element C, on a respective contact bearing 53, as is indicated in FIG. 31 (see also the arrow 54).

A similar refinement results from the lever bearing 45*b* which is illustrated in FIG. 32. As can be seen, the lever bearing 45*b* is mounted on an elastically flexible cap 55, thus likewise resulting in a movement on a curved path corresponding to the arrow 54 when the associated adjusting lever 27 is deflected.

In the embodiments illustrated in FIGS. 18 and 20 to 32, elastic deformation at the tilting-spring joints of the two adjusting levers 27 and 32 may also be sufficient on the basis of the natural elasticity for the minor adjusting and adjustment movements which occur in microlithography.

By way of example, each of the two load arms 27*b* and 32*b* of the two adjusting levers 27 and 32, respectively, or else the center part 24*a*, may likewise be in the form of a deformable compensating element. This also applies to the two force arms 27*a* and 32*a*.

The invention claimed is:

1. A positioning unit, comprising:
    a first connecting area configured to connect to an optical element,
    a second connecting area configured to connect to an object in the vicinity of the optical element,
    a first lever having a first lever bearing, a first force arm and a first load arm, the first lever being connected to the second connecting area via the first lever bearing,
    a second lever having a second lever bearing, a second force arm and a second load arm, the second lever being connected to the second connecting area via the second lever bearing,
    a hinged joint,
    an intermediate element configured to act on the hinged joint, the first load arm being connected to the first connecting area via the hinged joint and the intermediate element, and the second load arm being connected to the first connecting area via the hinged joint and the intermediate element, and
    a reinforcing element providing a mechanical connection between two elements selected from the group of elements consisting of:
        the second connecting area and the first force arm;
        the intermediate element and the first load arm; and
        the second connecting area and the intermediate element,
    wherein the positioning unit is configured to be used in a microlithographic projection exposure installation.

2. The position unit as claimed in claim 1, further comprising:
    a first adjustment device or a first actuator on the first force arm; and
    a second adjustment device or a second actuator on the second force arm.

3. The position unit as claimed in claim 1, wherein, in a first position, the first connecting area and the second connecting area are arranged relative to one another such that the first and second lever bearings and the hinged joint have approximately parallel rotation axes which lie approximately on one plane.

4. The positioning unit as claimed in claim 3, wherein the positioning unit is moveable to a second position in which, relative to the first position, the first and second levers are deflected.

5. The positioning unit as claimed in claim 3, wherein, in the first position, the approximately parallel rotation axes lie approximately on one plane, or lie on a first plane, which is covered by the rotation axes of the first and second lever bearings, and on a second plane, which is covered by the rotational axes of the joints associated with the first and second levers between the rotation axes of the first and second levers, the first and the second planes having a maximum separation of less than 0.1 times a separation between the first and second levers.

6. The positioning unit as claimed in claim 3, further comprising an elastically deformable compensating element between the first and second connecting areas.

7. The positioning unit as claimed in claim 6, wherein the elastically compensating element is fitted to at least one component selected from the group consisting of the first lever, the second lever, the intermediate element, a hinged connection, the first connecting area, the second connecting area, the first lever bearing, the second lever bearing, and parts thereof.

8. The positioning unit as claimed in claim 7, wherein the elastically compensating element comprises a curved path of a contact bearing of a least one lever bearing and/or of a hinged joint of a load arm.

9. The position unit as claimed in claim 1, wherein the reinforcing element is a tilting-spring joint arranged in a plane intersecting a rotation or tilting axis of a lever bearing or the hinged joint.

10. The position unit as claimed in claim 1, wherein the reinforcing element comprises a second hinged joint or a leaf spring arranged approximately on a straight line formed by the first and second lever bearings and/or the hinged joints.

11. The positioning unit as claimed in claim 1, wherein the intermediate element is connected to the first connecting area via a connecting hinged joint, in which, if there are a plurality of connecting hinged joints, their rotation axes are approximately parallel, and the rotation axis of at least one connecting hinged joint is aligned in the direction of the rotation axes of the hinged joints of the load arms.

12. The positioning unit as claimed in claim 1, wherein the hinged joint or at least one lever bearing is in the form of a solid hinged joint.

13. The positioning unit as claimed in claim 1, wherein the first connecting area is a head part, the second connecting area is a foot part, the intermediate element is at least one moving intermediate part, the adjustment device or the actuator is an adjusting element, and the object is an external holder in the vicinity of the optical element.

14. An exposure apparatus, comprising:
a projection objective, comprising:
a housing;
a plurality of lenses in the housing; and
a plurality of holders to hold the lenses, the plurality of holders comprising a first holder,
wherein the first holder comprises:
an external holder part connected to adjacent holders or to an objective structure of the projection objective; and
at least one device comprising:
a foot part connected to the external holder part,
a head part connected to a ring holding a lens, and
an intermediate element connected by a first elastic intermediate part to the foot part, the intermediate element being connected by a second elastic intermediate part to the head part, and
wherein at least one of the following holds:
the first elastic intermediate part comprises at least one element selected from the group consisting of a leaf spring and a tilting joint; and
the second elastic intermediate part comprises at least one element selected from the group consisting of a leaf spring or a tilting joint, and
wherein the at least one device comprises a positioning unit which comprises:
a first connecting area configured to connect to an optical element,
a second connecting area configured to connect to an object in the vicinity of the optical element,
a first lever having a first lever bearing, a first force arm and a first load arm, the first lever being connected to the second connecting area via the first lever bearing,
a second lever having a second lever bearing, a second force arm and a second load arm, the second lever being connected to the second connecting area via the second lever bearing,
a hinged joint,
an intermediate element configured to act on the hinged joint, the first load arm being connected to the first connecting area via the hinged joint and the intermediate element, and the second load arm being connected to the first connecting area via the hinged joint and the intermediate element, and
a reinforcing element providing a mechanical connection between two elements selected from the group of elements consisting of:
the second connecting area and the first force arm;
the intermediate element and the first load arm; and
the second connecting area and the intermediate element.

15. The exposure apparatus according to claim 14, wherein the at least one device comprises at least three devices.

16. The exposure apparatus according to claim 15, wherein the at least three devices bear the weight of the at least one lens.

17. The exposure apparatus according to claim 14, wherein the at least one device comprises at least one adjustment element selected from the group consisting of an adjusting screw, an electromagnetic drive, a piezo drive, a pneumatic drive, a magnetostrictive drive, and a hydraulic drive.

18. The exposure apparatus according to claim 14, wherein the at least one device bears at least part of the weight of the one lens.

19. An exposure apparatus, comprising:
a projection objective, comprising:
a housing;
a plurality of lenses in the housing; and
a plurality of holders to hold the lenses, the plurality of holders comprising a first holder,
wherein the first holder comprises:
an external holder part connected to adjacent holders or to an objective structure of the projection objective; and
at least one device comprising:
a foot part connected to the external holder part,
a head part connected to a ring holding a lens, and
an intermediate element connected by a first elastic intermediate part to the foot part, the intermediate element being connected by a second elastic intermediate part to the head part, and wherein the at least one device comprises a positioning unit which comprises:
   a first connecting area configured to connect to an optical element,
   a second connecting area configured to connect to an object in the vicinity of the optical element,
   a first lever having a first lever bearing, a first force arm and a first load arm, the first lever being connected to the second connecting area via the first lever bearing,
   a second lever having a second lever bearing, a second force arm and a second load arm, the second lever being connected to the second connecting area via the second lever bearing,
   a hinged joint,
   an intermediate element configured to act on the hinged joint, the first load arm being connected to the first connecting area via the hinged joint and the intermediate element, and the second load arm being connected to the first connecting area via the hinged joint and the intermediate element, and
   a reinforcing element providing a mechanical connection between two elements selected from the group of elements consisting of:
      the second connecting area and the first force arm;
      the intermediate element and the first load arm; and
      the second connecting area and the intermediate element.

20. The exposure apparatus according to claim 19, wherein the at least one device comprises at least three devices.

21. The exposure apparatus according to claim 20, wherein the at least three devices bear the weight of the at least one lens.

22. The exposure apparatus according to claim 19, wherein the at least one device comprises at least one adjustment element selected from the group consisting of an adjusting screw, an electromagnetic drive, a piezo drive, a pneumatic drive, a magnetostrictive drive, and a hydraulic drive.

23. The exposure apparatus according to claim 19, wherein the at least one device bears at least part of the weight of the one lens.

* * * * *

UNITED STATES PATENT AND TRADEMARK OFFICE
CERTIFICATE OF CORRECTION

PATENT NO. : 8,416,515 B2  
APPLICATION NO. : 13/230398  
DATED : April 9, 2013  
INVENTOR(S) : Ulrich Weber and Jens Kugler It is certified that error appears in the above-identified patent and that said Letters Patent is hereby corrected as shown below:

In the Specification

Column 3, Line 48, delete "of" insert --of a--;

Column 4, Line 63, delete "device," insert --device--;

Column 9, Line 60, delete "degrees" insert --90 degrees--;

Column 10, Line 37, delete "and" insert --34 and--;

Column 11, Line 44, delete "center," insert --center--;

Column 14, Line 46, delete "can" insert --49 can--;

In the Claims

Column 17, Line 29, Claim 8, delete "a least" insert --at least--.

Signed and Sealed this  
Thirty-first Day of December, 2013

Margaret A. Focarino  
*Commissioner for Patents of the United States Patent and Trademark Office*